United States Patent
Yu et al.

(10) Patent No.: US 10,796,767 B2
(45) Date of Patent: Oct. 6, 2020

(54) MEMORY DEVICE AND OPERATING METHOD THEREOF

(71) Applicant: SAMSUNG ELECTRONICS CO., LTD., Suwon-si, Gyeonggi-Do (KR)

(72) Inventors: Changyeon Yu, Hwaseong-si (KR); Minsu Kim, Hwaseong-si (KR); Hyun-Wook Park, Hwaseong-si (KR); Bongsoon Lim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/199,098

(22) Filed: Nov. 23, 2018

(65) Prior Publication Data

US 2019/0371408 A1 Dec. 5, 2019

(30) Foreign Application Priority Data

May 31, 2018 (KR) .................. 10-2018-0062528

(51) Int. Cl.
*G11C 16/34* (2006.01)
*G11C 16/14* (2006.01)
*G11C 16/24* (2006.01)
*G11C 16/04* (2006.01)

(52) U.S. Cl.
CPC .......... *G11C 16/14* (2013.01); *G11C 16/0483* (2013.01); *G11C 16/24* (2013.01)

(58) Field of Classification Search
CPC ................................. G11C 16/3454

USPC ......................... 365/185.22, 185.2
See application file for complete search history.

(56) References Cited

U.S. PATENT DOCUMENTS

| | | |
|---|---|---|
| 7,245,533 B2 | 7/2007 | Shibata |
| 7,679,133 B2 | 3/2010 | Son et al. |
| 8,000,151 B2 | 8/2011 | Yamada et al. |
| 8,189,391 B2 | 5/2012 | Itagaki et al. |
| 8,553,466 B2 | 10/2013 | Han et al. |
| 8,559,235 B2 | 10/2013 | Yoon et al. |
| 8,654,587 B2 | 2/2014 | Yoon et al. |
| 8,885,412 B2 | 11/2014 | Li et al. |
| 9,019,775 B2 | 4/2015 | Costa et al. |
| 9,064,584 B2 | 6/2015 | Jung |
| 2011/0085385 A1* | 4/2011 | Park .................. G11C 11/5621 365/185.22 |
| 2011/0233648 A1 | 9/2011 | Seol et al. |
| 2015/0348634 A1 | 12/2015 | Koo et al. |

FOREIGN PATENT DOCUMENTS

JP H0846159 A 2/1996

* cited by examiner

*Primary Examiner* — Jason Lappas
(74) *Attorney, Agent, or Firm* — Volentine, Whitt & Francos, PLLC

(57) ABSTRACT

A memory device includes a cell array and a page buffer circuit. The cell array includes first and second cell strings respectively connected to first and second bit lines. The page buffer circuit is configured to apply an erase voltage to the first bit line and to allow the second bit line to be in a floating state, when an erase operation is performed on memory cells of the first and second cell strings.

14 Claims, 15 Drawing Sheets

| BL | VERS |
| SSL2 | Vlow |
| SSL1 | Float |
| WL | Vss |
| GSL | Float |

MEMORY DEVICE AND OPERATING METHOD THEREOF

CROSS-REFERENCE TO RELATED APPLICATIONS

A claim of priority under 35 U.S.C. § 119 is made to Korean Patent Application No. 10-2018-0062528, filed on May 31, 2018, in the Korean Intellectual Property Office, the entire contents of which are hereby incorporated by reference.

BACKGROUND OF THE INVENTION

The present inventive concepts herein relate to semiconductor memory devices, and in particular to three-dimensional memory devices configured to execute an erase operation.

Semiconductor memories may be classified into volatile memory devices in which stored data are lost when power is interrupted, and nonvolatile memory devices in which stored data are retained even when power is interrupted.

Flash memory, which is an example of nonvolatile memory, is widely used as large capacity storage media. In view of the increasing demand for highly-integrated flash memory, three-dimensional flash memory is being developed.

The integration density of three-dimensional flash memory may be increased by increasing the number of stacked word lines in the three-dimensional flash memory. Increasing the number of stacked word lines however results in increased thickness of flash memory chips. Due to technical requirements of semiconductor packages, it is impossible to continue to increase the thickness of flash memory chips. Accordingly, various process technologies are being developed to reduce the thickness of the flash memory chips. However, as process technologies are used to reduce chip thickness, it becomes difficult to perform bulk erase operations.

SUMMARY

Embodiments of the inventive concepts provide a memory device, in which an erase operation is performed using a method other than a bulk erase method, and a method of operating the memory device.

Embodiments of the inventive concepts provide a memory device including a cell array including a first cell string and a second cell string respectively connected to a first bit line and a second bit line; and a page buffer circuit configured to apply an erase voltage to the first bit line and place the second bit line in a floating state at a same time, when an erase operation is performed on memory cells of the first and second cell strings.

Embodiments of the inventive concepts further provide a memory device including a cell array including a first cell string and a second cell string respectively connected to a first bit line and a second bit line; a first page buffer configured to apply an erase voltage to the first bit line when an erase operation is performed on memory cells of the first cell string and the second cell string; and a second page buffer configured to prevent the erase voltage from being applied to the second bit line, when the erase operation is performed.

Embodiments of the inventive concepts still further provide a method of operating a memory device including a controller that provides control signals to a page buffer circuit, and including a first cell string and a second cell string respectively connected to a first bit line and a second bit lines. The method includes receiving, by the controller, an erase command for an erase operation of memory cells of the first cell string and the second cell string, and providing the control signals responsive to the erase command; applying an erase voltage from the page buffer circuit during the erase operation to the first bit line in response to the control signals; and placing, by the page buffer circuit, the second bit line in a floating state at a same time that the erase voltage is applied to the first bit line, in response to the control signals.

BRIEF DESCRIPTION OF THE DRAWINGS

Example embodiments of the inventive concepts will described in detail with reference to the accompanying drawings.

DETAILED DESCRIPTION

Embodiments of the inventive concepts will be more fully described with reference to the accompanying drawings.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
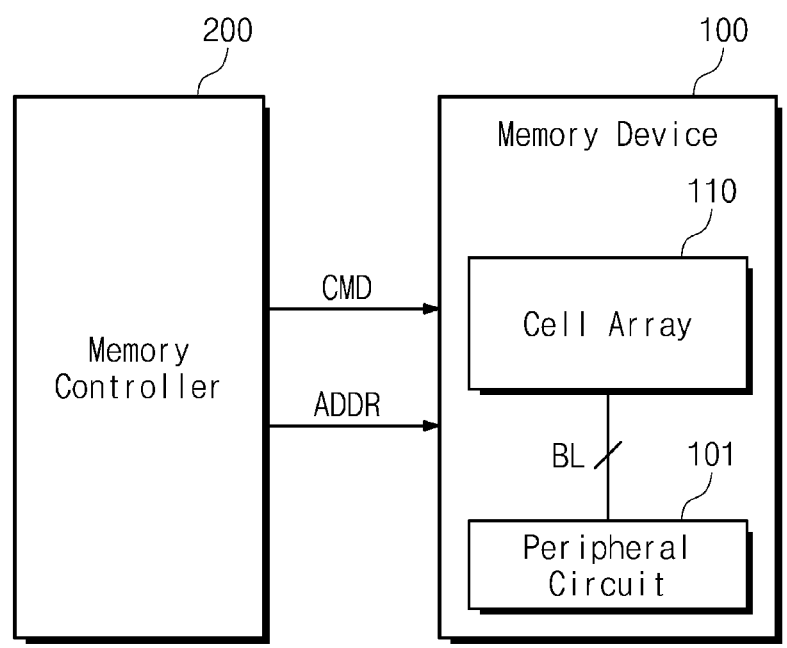
FIG. 1 illustrates a block diagram of a storage device according to an embodiment of the inventive concepts.

FIG. 1 illustrates a block diagram of a storage device according to an embodiment of the inventive concepts. Referring to FIG. 1, a storage device 10 includes a memory device 100 and a memory controller 200. The memory device 100 may execute various operations (e.g., program, read, and erase operations), based on a command CMD and an address ADDR provided from the memory controller 200.

The memory device 100 may include, for example, a flash memory device, but the inventive concepts are not limited to including a flash memory device. The memory device 100 may include at least one of volatile memories such as for example static RAM, dynamic RAM, or synchronous DRAM, or non-volatile memories such as for example read only memory (ROM), programmable ROM (PROM), electrically programmable ROM (EPROM), electrically erasable and programmable ROM (EEPROM), phase-change RAM (PRAM), magnetic RAM (MRAM), resistive RAM (RRAM), or ferroelectric RAM (FRAM).

The memory device 100 includes a cell array 110 and a peripheral circuit 101. The cell array 110 may include a plurality of memory blocks, and each of the memory blocks may include a plurality of memory cells. Each of the memory cells may be used to store data.

The peripheral circuit 101 may be connected to the cell array 110 through a variety of signal lines including bit lines BL. The peripheral circuit 101 may be configured to generate various voltages, which are applied to the signal lines and are used to control the cell array 110. The voltages provided from the peripheral circuit 101 may be adjusted to store data into the cell array 110 or to erase data stored in the cell array 110. For example, the peripheral circuit 101 may include additional circuits (e.g., a page buffer circuit (not shown) and an address decoder (not shown)), which are configured to execute various other functions.

The memory controller 200 may transmit the command CMD and the address ADDR to the memory device 100 to control operations of the memory device 100. In some embodiments, the memory controller 200 may store data in the memory device 100 or may read or erase data stored in the memory device 100.

In a case where the command CMD and the address ADDR for an erase operation are transmitted to the memory device 100, the memory device 100 may execute the erase operation using the peripheral circuit 101. For example, in an erase operation, the memory device 100 may apply an erase voltage to a bit line BL connected to the cell array 110 through the peripheral circuit 101. The erase voltage applied to the bit line BL may be used to erase data stored in the cell array 110.

Alternatively, in a case where the command CMD and the address ADDR for the erase operation are transmitted to the memory device 100, the memory device 100 may apply an erase voltage to a substrate (not shown) of the cell array 110. The erase voltage applied to the substrate may be used to erase data stored in the cell array 110.

In other words, the erase operation of erasing data from the cell array 110 may be achieved by applying an erase voltage, which is provided from the memory device 100, to the substrate of cell array 110 or to a bit line BL connected to cell array 110. The erase operation of applying an erase voltage to a bit line BL will be described in more detail with reference to the accompanying drawings.

Figure 2:
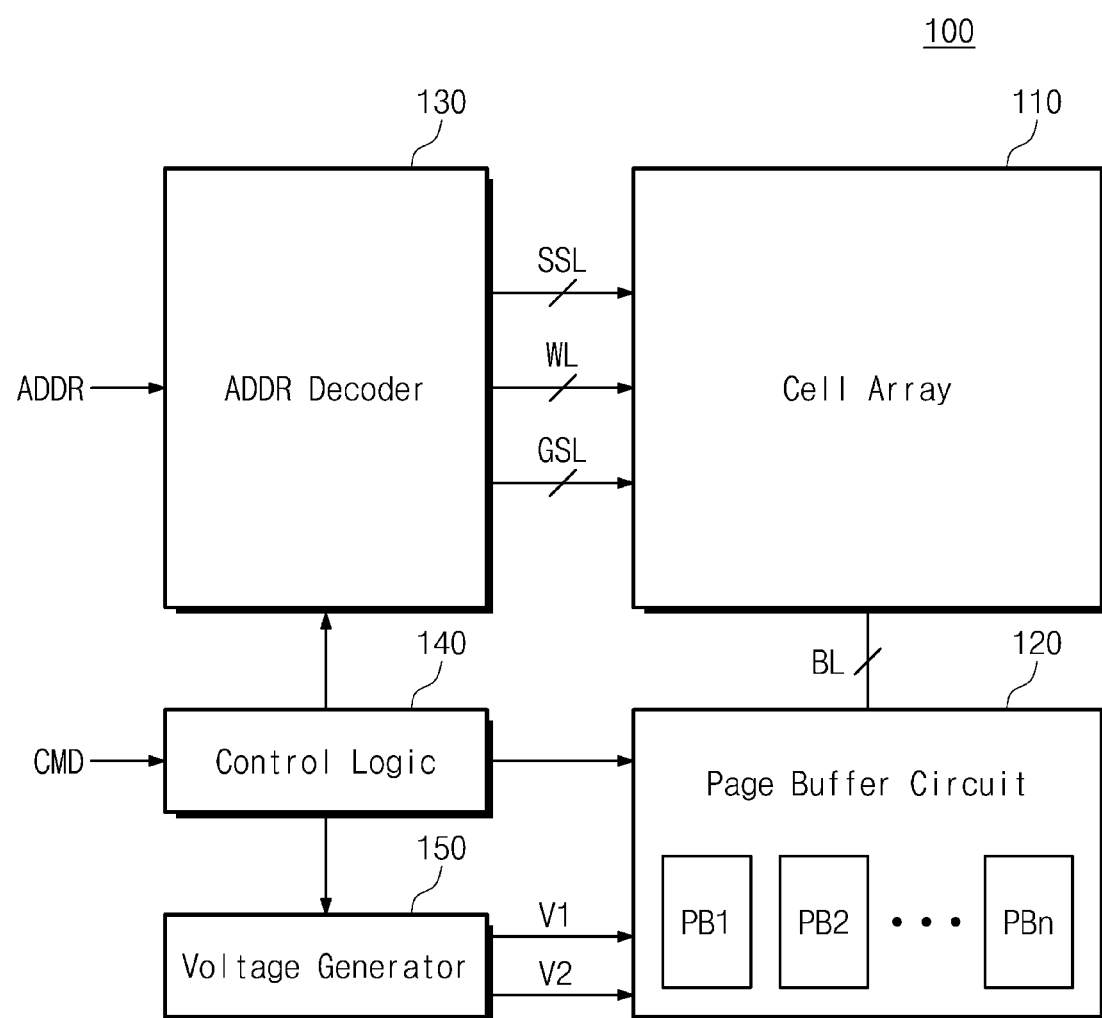
FIG. 2 illustrates a block diagram of an example of a memory device of FIG. 1.

FIG. 2 illustrates a block diagram of an example of the memory device 100 of FIG. 1. Referring to FIG. 2, the memory device 100 includes a page buffer circuit 120, an address decoder 130, a control logic 140 (which may be characterized as a controller), and a voltage generator 150, in addition to the cell array 110. The page buffer circuit 120, the address decoder 130, the control logic 140, and the voltage generator 150 in FIG. 2 may together be characterized as corresponding to the peripheral circuit 101 shown in FIG. 1.

The cell array 110 is connected to the address decoder 130 through word lines WL or selection lines SSL and GSL. The cell array 110 is connected to the page buffer circuit 120 through the bit lines BL. The cell array 110 may include a plurality of cell strings. Each of the cell strings may include a plurality of memory cells. Each or some of the memory cells may be programmed, erased, or read using voltages provided through the bit line BL or the word line WL.

The page buffer circuit 120 may apply several different voltages to the bit lines BL to execute the program or erase operations on the cell array 110. The page buffer circuit 120 may receive a control signal transmitted from the control logic 140 and may operate based on the control signal. The page buffer circuit 120 may receive a first voltage V1 and a second voltage V2 from the voltage generator 150 and may apply several different voltages, which are generated using the first voltage V1 or the second voltage V2, to the bit lines BL.

During a program operation, the page buffer circuit 120 may generate a program voltage, which corresponds to data to be programmed, using the first voltage V1, and then may apply the program voltage to a bit line BL. During an erase operation, the page buffer circuit 120 may generate an erase voltage using the second voltage V2 and then may apply the erase voltage to a bit line BL. The first voltage V1 may be lower than the second voltage V2.

The page buffer circuit 120 may include a plurality of page buffers PB1, PB2-PBn (which may hereinafter be referred to as page buffers PB1-PBn). Each of the page buffers PB1-PBn may be connected to one or more bit lines BL. Each of the page buffers PB1-PBn may operate in response to a control signal transmitted from the control logic 140. For example, each of the page buffers PB1-PBn may receive the first voltage V1 from the voltage generator 150 and may generate several different voltages from the first voltage V1. Each of the page buffers PB1-PBn may apply the several different voltages, which are generated from the first voltage V1, to a bit line BL connected thereto, in response to the control signal. The voltage generated by each of the page buffers PB1-PBn may have a magnitude that is substantially equal or similar to that of the first voltage V1.

Some of the page buffers PB1-PBn may be configured to receive only the first voltage V1, and others may be configured to receive both of the first and second voltages V1 and V2. In other words, only some of the page buffers PB1-PBn may include a circuit receiving the second voltage V2. The page buffer, which is configured to receive the second voltage V2, may apply the received second voltage V2 to a bit line BL connected thereto, in response to the control signal transmitted from the control logic 140.

The address decoder 130 is connected to the cell array 110 through a plurality of the ground selection lines GSL, a plurality of the word lines WL, and a plurality of the string selection lines SSL. The address decoder 130 may receive the address ADDR from the memory controller 200 and may operate under control of the control logic 140. The address decoder 130 may decode the received address ADDR and may control application of voltages to the word lines WL based on the decoded address. For example, during an erase operation, the address decoder 130 may apply a ground voltage to the word lines WL of a selected memory block, which is indicated by the address ADDR.

The control logic 140 may receive the command CMD from the memory controller 200. The control logic 140 may decode the received command CMD and may control overall operations of the memory device 100, based on the decoded command. For example, in the case where a command CMD corresponding to an erase operation is received, the control logic 140 may transmit control signals to the page buffer circuit 120, the address decoder 130, and the voltage generator 150 to control operations of each of the page buffer circuit 120, the address decoder 130, and the voltage generator 150. The address decoder 130 may apply the ground voltage to the word lines WL of a selected memory block in response to the transmitted control signal. The voltage generator 150 may provide the second voltage V2 to the page buffer circuit 120 in response to the transmitted control signal. The page buffer circuit 120 may apply the erase voltage to a bit line BL in response to the transmitted control signal. The erase voltage applied to the bit line BL may be the second voltage V2 provided from the voltage generator 150.

The voltage generator 150 may generate several different voltages, which are used to operate the memory device 100, and may provide the generated voltages to various circuits. For example, the voltage generator 150 may be configured to generate the first voltage V1 with a low voltage level and then to provide the first voltage V1 to the page buffer circuit 120. The voltage generator 150 may also be configured to generate the second voltage V2 with a high voltage level and then to provide the second voltage V2 to the page buffer circuit 120. A magnitude of each of the first and second voltages V1 and V2 may be fixed or changed depending on a desired situation.

Although FIG. 2 illustrates an example in which the voltage generator 150 is configured to provide a voltage to only the page buffer circuit 120, the inventive concepts are not limited to this example. For example, the voltage generator 150 may be configured to provide voltages to various circuits, such as the address decoder 130.

Figure 3:
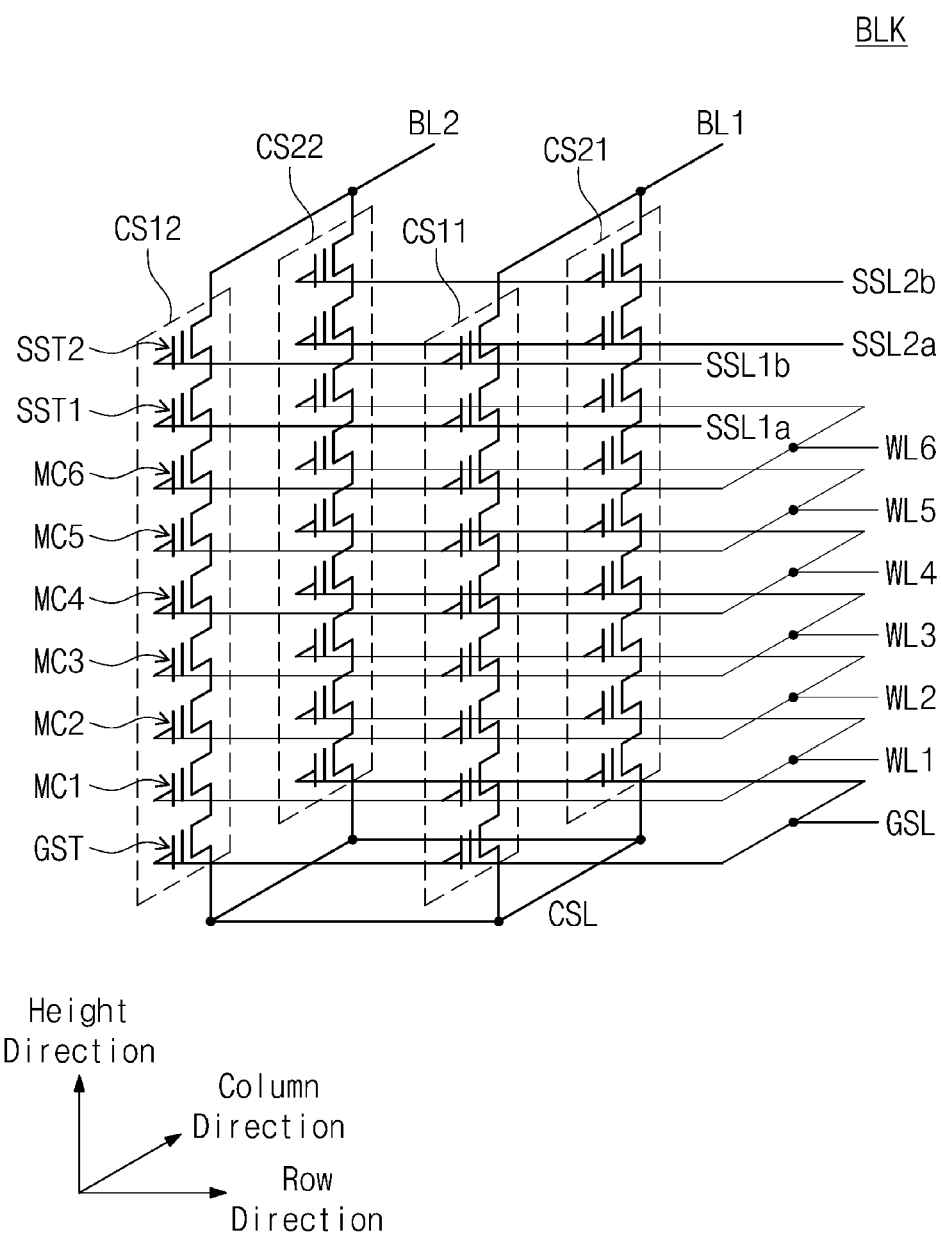
FIG. 3 illustrates a circuit diagram of an example of a memory block of a cell array of FIG. 2.

FIG. 3 illustrates a circuit diagram one of an example of a memory block of a cell array of FIG. 2. Referring to FIG. 3, a memory block BLK includes a plurality of cell strings CS11, CS12, CS21, and CS22. The cell strings CS11, CS12, CS21, and CS22 are arranged in a row direction and a column direction to form a plurality of rows and a plurality of columns.

Each of the cell strings CS11, CS12, CS21, and CS22 may include a plurality of cell transistors. For example, each of the cell strings CS11, CS12, CS21, and CS22 may include string selection transistors SST1 and SST2, a plurality of memory cells MC1-MC6 (i.e., MC1, MC2, MC3, MC4, MC5 and MC6), and a ground selection transistor GST. In some embodiments, each of the cell transistors included in the cell strings CS11, CS12, CS21, and CS22 may be a charge trap flash (CTF) memory cell.

The memory cells MC1-MC6 are connected in series and stacked in a height direction, which is normal to a plane defined by the row and column directions (i.e., a top surface of a substrate). The string selection transistors SST1 and SST2 may be connected in series and may be provided between the memory cells MC1-MC6 and bit lines BL1 and BL2. The ground selection transistor GST may be provided between the memory cells MC1-MC6 and a common source line CSL.

The ground selection transistors GST of the cell strings CS11, CS12, CS21, and CS22 are connected in common to the ground selection line GSL. In some embodiments, the ground selection transistors in a same row may be connected to one of ground selection lines, and the ground selection transistors in different rows may be connected to different ones of the ground selection lines. For example, the ground selection transistors GST of the cell strings CS11 and CS12 in the first row may be connected to a first ground selection line, and the ground selection transistors GST of the cell strings CS21 and CS22 in the second row may be connected to a second ground selection line.

In some embodiments, although not illustrated in the drawings, the ground selection transistors located at the same level from a substrate (not shown) may be connected to one of the ground selection lines, and the ground selection transistors located at different levels may be connected to different ones of the ground selection lines.

The memory cells located at the same level from the substrate or the ground selection transistor GST may be connected in common to one of the word lines, and the memory cells located at different levels may be connected to different ones of the word lines. For example, a plurality of the memory cells MC1 in the cell strings CS11, CS12, CS21, and CS22 may be connected in common to a word line WL1, a plurality of the memory cells MC2 in the cell strings CS11, CS12, CS21, and CS22 may be connected in common to a word line WL2, and the rest of the memory cells MC3, MC4, MC5 and MC6 may similarly be respectively connected in common to the word lines WL3, WL4, WL5 and WL6.

Among the first string selection transistors SST1 located at the same level, the string selection transistors in a same row may be connected in common to one of the string selection lines, and the string selection transistors in different rows may be connected to different ones of the string selection lines. For example, the first string selection transistors SST1 of the cell strings CS11 and CS12 in the first row may be connected in common to a string selection line SSL1a, and the first string selection transistors SST1 of the cell strings CS21 and CS22 in the second row may be connected in common to a string selection line SSL2a.

Similarly, among the second string selection transistors SST2 located at the same level, the string selection transistors in a same row may be connected in common to one of the string selection lines, and the string selection transistors in different rows may be connected to different ones of the string selection lines. For example, the second string selection transistors SST2 of the cell strings CS11 and CS12 in the first row may be connected in common to a second string selection line SSL1b, and the second string selection transistors SST2 of cell strings CS21 and CS22 in the second row may be connected in common to a second string selection line SSL2b.

In some embodiments, to erase data stored in the memory cells of the cell strings CS11, CS12, CS21, and CS22, an erase voltage may be applied to the first and second bit lines BL1 and BL2. The cell strings CS11, CS12, CS21, and CS22 during an erase operation will be described in more detail with reference to FIGS. 4 and 5.

It should be understood that FIG. 3 illustrates an example of a memory block BLK, and that the number of the cell strings may be increased or decreased as needed, and the numbers of the rows and columns of the cell strings depend on the number of the cell strings. Furthermore, the number of cell transistors MC and the selection transistors GST and SST stacked in the memory block BLK may also be increased or decreased, and the memory block BLK may therefore have a height different from that shown in FIG. 3. Similarly, the number of lines GSL, WL, and SSL stacked and connected to the cell and selection transistors may be changed depending on the number of stacked cell and selection transistors.

Figure 4:
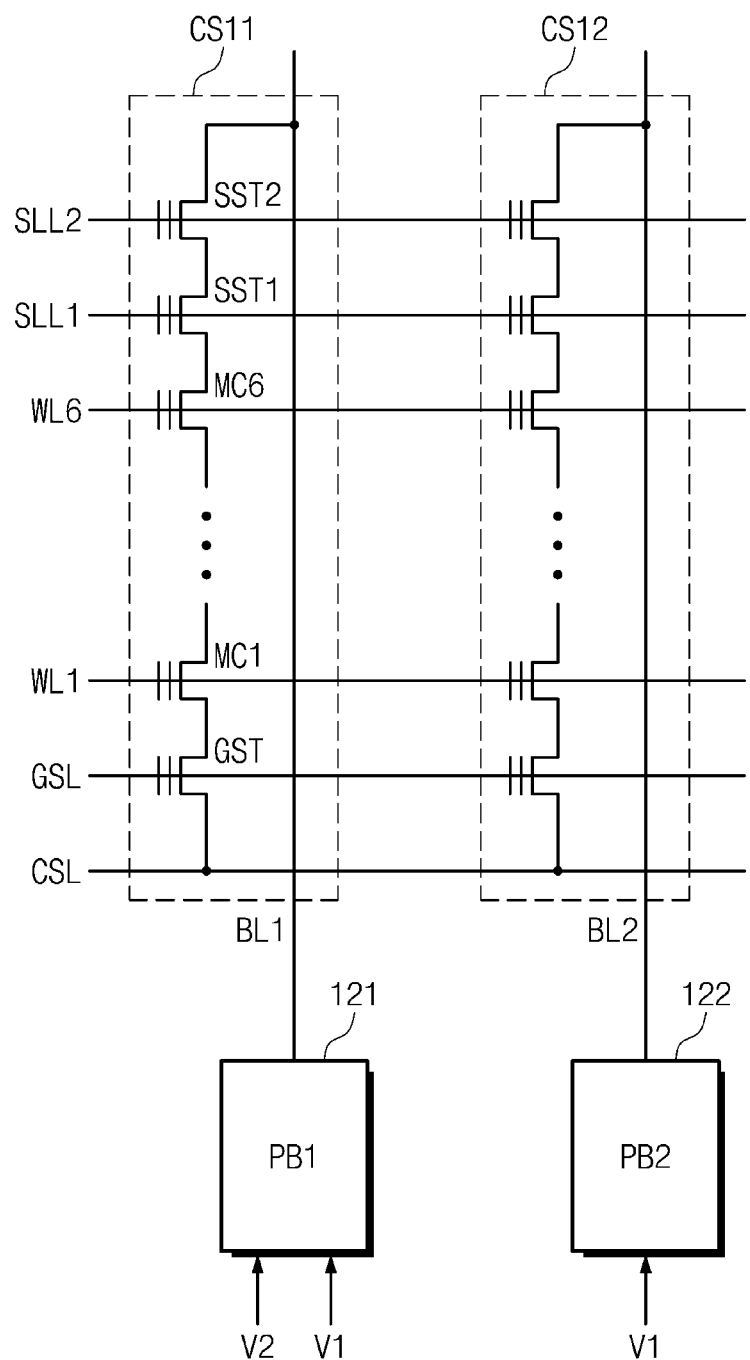
FIG. 4 illustrates a diagram of an example of a connection structure between the page buffers and the cell strings respectively illustrated in FIGS. 2 and 3.

FIG. 4 illustrates a diagram of an example of a connection structure between the page buffers and the cell strings, which are respectively illustrated in FIGS. 2 and 3. FIG. 4 shows a first cell string CS11 and a second cell string CS12 of a block BLK of the cell array 110. The first and second cell strings CS11 and CS12 in this embodiment are connected to respective different bit lines. The first and second cell strings CS11 and CS12 may be located adjacent to each other. However, the inventive concepts are not limited as here described, and in some embodiments at least one other cell string may be located between the first and second cell strings CS11 and CS12.

FIG. 4 shows a first page buffer 121 and a second page buffer 122 of page buffer circuit 120 shown in FIG. 2. As shown, the first cell string CS11 is connected to the first page buffer 121 through a first bit line BL1, and the second cell string CS12 is connected to the second page buffer 122 through a second bit line BL2. The first bit line BL1 and the second bit line BL2 may be adjacent to each other. For example, in the case where, as shown in FIG. 3, the first and second bit lines BL1 and BL2 are elongated in a column direction, the first and second bit lines BL1 and BL2 may be spaced apart from, but adjacent to, each other in a row direction. However, the inventive concepts are not limited as here described, and in some embodiments at least one other bit line may be located between the first and second bit lines BL1 and BL2.

Each of the first and second cell strings CS11 and CS12 includes a ground selection transistor GST, first to sixth memory cells MC1-MC6, and first and second string selection transistors SST1 and SST2. The first and second cell strings CS11 and CS12 are connected to the first and second bit lines BL1 and BL2, respectively, through second string selection transistors SST2. Gate electrodes of the first string selection transistors SST1 are connected to a first string selection line SSL1, and gate electrodes of the second string selection transistor SST2 are connected to a second string selection line SSL2. The second string selection line SSL2 may be the topmost one of the string selection lines.

Gate electrodes of each of the first to sixth memory cells MC1-MC6 are connected to a corresponding one of the word lines. Each of the first and second cell strings CS11 and CS12 are connected to the common source line CSL through the ground selection transistors GST. Gate electrodes of the ground selection transistors GST may be connected to the ground selection line GSL.

The first page buffer 121 receives the first and second voltages V1 and V2. In the first page buffer 121, the received first voltage V1 may be used to apply a low voltage to the first bit line BL1. For example, the first page buffer 121 may be used to apply a program inhibition voltage to the first bit line BL1. In the first page buffer 121, the received second voltage V2 may be used to apply a high voltage to the first bit line BL1. For example, the first page buffer 121 may be used to apply an erase voltage to the first bit line BL1.

During a program operation, the first page buffer 121 may setup or precharge the first bit line BL1 using the first voltage V1. During the program operation, the first bit line BL1 may be setup to a voltage of 0V or a power voltage by the first page buffer 121. During a verify read operation, the first bit line BL1 may be pre-charged by the first page buffer 121.

During an erase operation, the first page buffer 121 may apply the erase voltage to the first bit line BL1. The erase voltage may be, for example, a high voltage of 10 V or higher. In the case where the erase voltage is applied to the first bit line BL1, a gate-induced drain leakage (GIDL) phenomenon may occur in the topmost transistor (e.g., the second string selection transistor SST2) of the first cell string CS11. As a result of the GIDL phenomenon, holes may be injected into a channel region of the first cell string CS11. The holes may produce a reverse bias, allowing electrons to be exhausted from the first to sixth memory cells MC1-MC6, and this process may be used as the erase operation on the first to sixth memory cells MC1-MC6.

Alternatively, in the erase operation, the first page buffer 121 may apply a GIDL voltage for inducing the GIDL phenomenon to the first bit line BL1 for a given time period. The GIDL voltage may be, for example, lower than the erase voltage and may be higher than the minimum voltage capable of inducing the GIDL phenomenon. In the case where the GIDL voltage is applied to the first bit line BL1, holes may be produced in the topmost transistor (e.g., the second string selection transistor SST2) of the first cell string CS11 and may be injected into the channel region of the first cell string CS11. The GIDL voltage may be applied to the first bit line BL1 for a predetermined time period, and then, the first page buffer 121 may apply the erase voltage to the first bit line BL1. The application of the erase voltage may maintain the injection of holes into the channel region of the first cell string CS11. The holes may produce a reverse bias, allowing electrons to be exhausted from the first to sixth memory cells MC1-MC6, and this process may be used as the erase operation on the first to sixth memory cells MC1-MC6.

The second page buffer 122 receives the first voltage V1, but not the second voltage V2. In the second page buffer 122, the first voltage V1 may be used to apply a low voltage to the second bit line BL2. For example, similar to the first page buffer 121, in the second page buffer 122, the first voltage V1 may be used to apply a program inhibition voltage to the second bit line BL2. During a program operation, the second page buffer 122 may setup or precharge the second bit line BL2 using the first voltage V1.

When the erase operation is performed on the memory cells included in the second cell string CS12, the second page buffer 122 may operate to allow the second bit line BL2 to be in a floating state. The bit line in a floating state may be understood to mean that the bit line is not connected electrically to another non-floating conductor. In other words, during the erase operation the second page buffer 122 prevents the erase voltage (e.g., the second voltage V2) from being applied (i.e., connected) to the second bit line BL2. During the erase operation, if the erase voltage is applied to the first bit line BL1 and the second bit line BL2 is in a floating state, the second bit line BL2 may be electrically coupled with the first bit line BL1, and as a result of the coupling, a voltage of the second bit line BL2 may be increased to the erase voltage. In the case where the voltage of the second bit line BL2 is increased to the erase voltage, the GIDL phenomenon may occur, and this phenomenon may be used to perform the erase operation on the second cell string CS12. In this case, electrically coupled (or coupled as may be hereinafter used) should be understood to mean that at least some of the voltage applied to the first bit line BL1 for example is transferred to the second bit line BL2 even though the first and second bit lines BL1 and BL2 are not physically connected together or touching each other.

In some embodiments, the voltage of the second bit line BL2, which is increased by the coupling, may be substantially equal to the erase voltage applied to the first bit line BL1. In the case where the voltages of the first and second bit lines BL1 and BL2 have the same voltage (e.g., the erase voltage), memory cells connected to each of the bit lines may be normally erased. For example, the memory cells connected to the first and second bit lines BL1 and BL2 may be erased to have substantially the same erase state.

In some embodiments, even when the voltage of the second bit line BL2 is increased by the aforementioned coupling, a magnitude of the voltage of the second bit line BL2 may be different from that of a desired voltage (i.e., a magnitude of the erase voltage applied to the first bit line BL1). That is, there may be a voltage difference between the first and second bit lines BL1 and BL2. To prevent such a voltage difference, the second bit line BL2 may be pre-charged in advance. For example, the second bit line BL2 may be pre-charged in advance to a positive or negative voltage. This may be used to allow the voltage of the second bit line BL2, which is increased by the coupling, to be substantially the same as the voltage of the first bit line BL1.

As described above, during an erase operation on the cell array 110, the memory device 100 may be configured to apply the erase voltage to the bit lines BL through the page buffer circuit 120 and to erase data of the memory cells using the GIDL phenomenon. In more detail, the memory device 100 is configured to directly apply the erase voltage to some of the bit lines BL through the page buffer circuit 120, but to allow others of the bit lines BL adjacent thereto to be in a floating state. In this case, as a result of a coupling between the bit lines BL, the bit lines BL in the floating state may have an increased voltage (e.g., the erase voltage).

In FIGS. 3 and 4, each of the cell strings is illustrated to include the first and second string selection transistors SST1 and SST2, but the inventive concept is not limited as here described. For example, each of the cell strings may be configured to include one string selection transistor, or to include three or more string selection transistors. In other words, each of the cell strings may be coupled to one string selection line or three or more string selection lines. For convenience, the description that follows will refer to an example in which each of the cell strings is configured to include the first and second string selection transistors SST1 and SST2, as shown in FIGS. 3 and 4.

Figures 5, 6:
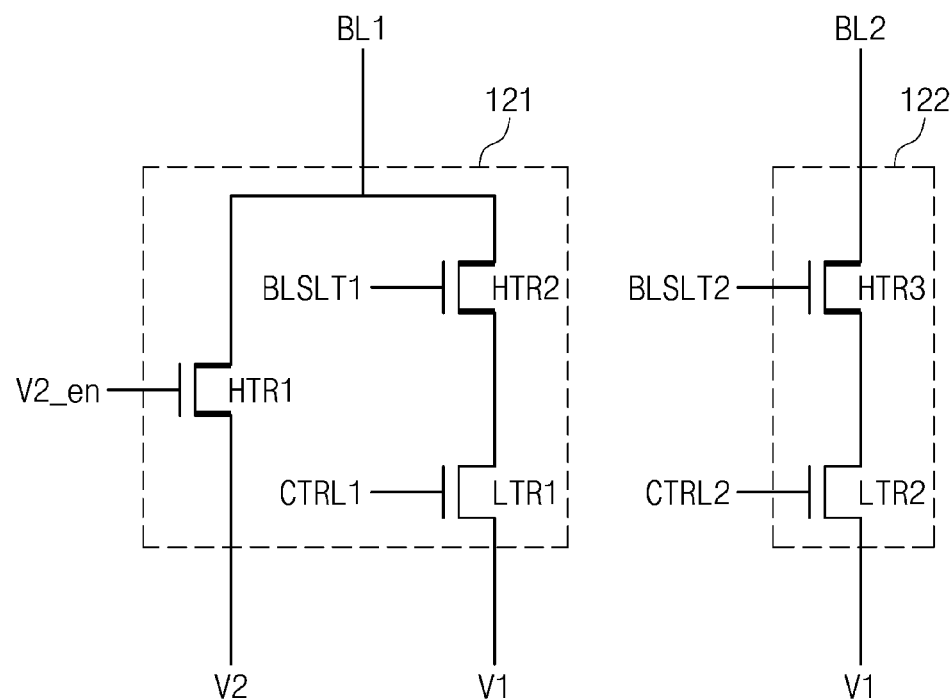
FIG. 5 illustrates a table showing an example of a bias condition for an erase operation according to an embodiment of the inventive concepts.
FIG. 6 illustrates a circuit diagram of an example of the page buffer of FIG. 4.

FIG. 5 illustrates a table showing an example of a bias condition for an erase operation according to an embodiment of the inventive concepts. Referring to FIG. 5, during the erase operation, an erase voltage VERS is applied to the bit line BL, and a low voltage Vlow is applied to the second string selection line SSL2. A ground voltage Vss is applied to the word line WL. The first string selection line SSL1 and the ground selection line GSL are in a floating state.

As shown in FIG. 4, the erase voltage VERS may be a voltage which is directly applied from the second voltage V2 through the first page buffer 121 or is induced by the coupling between the bit lines BL. The erase voltage VERS may for example be a high voltage of 10 V or higher. The second string selection line SSL2 may be the topmost line of the string selection lines. That is, in a case where the cell string is configured to have one string selection line, the string selection line may be used as the second string selection line SSL2. In contrast, in a case where the cell string is configured to have the first and second string selection lines SSL1 and SSL2 as shown in FIG. 4, the second string selection line SSL2 may be the topmost string selection line. The low voltage Vlow applied to the second string selection line SSL2 may be, for example, a voltage of 5V or lower.

In the case where the erase voltage VERS and the low voltage Vlow are respectively provided to the bit line BL and the second string selection line SSL2, a GIDL phenomenon may occur owing to a voltage difference there between. In the cell string connected to the bit line BL, the GIDL phenomenon may be used to erase data, which are stored in the memory cells of the cell string.

FIG. 6 illustrates a circuit diagram of an example of the page buffer of FIG. 4. The page buffer circuit 120 in FIG. 6 includes the first page buffer 121 and the second page buffer 122 (as shown in FIG. 4). The first page buffer 121 is connected to the first bit line BL1, and the second page buffer 122 is connected to the second bit line BL2.

The first page buffer 121 includes first and second high-voltage transistors HTR1 and HTR2 and a first low-voltage transistor LTR1. The first high-voltage transistor HTR1 includes two terminals, one of which is connected to the first bit line BL1, and the other of which is connected to a line supplied with the second voltage V2. An operation of the first high-voltage transistor HTR1 may be controlled by a second voltage enable signal V2_en applied to the gate of the first high-voltage transistor HTR1. The first high-voltage transistor HTR1 may be turned on or off by the second voltage enable signal V2_en. For example, the first high-voltage transistor HTR1 may be turned on in response to the second voltage enable signal V2_en set to a logical high, and in this case, the second voltage V2 may be applied to the first bit line BL1. During an erase operation, the second voltage V2, which is applied to the first bit line BL1 through the first high-voltage transistor HTR1, may be the erase voltage. The first high-voltage transistor HTR1 may be turned off in response to the second voltage enable signal V2_en set to a logical low, and in this case, the second voltage V2 is not applied to the first bit line BL1. Since the second voltage V2 applied to the first high-voltage transistor HTR1 is a high voltage, the first high-voltage transistor HTR1 may be a high-voltage transistor.

The second high-voltage transistor HTR2 includes two terminals, one of which is connected to the first bit line BL1, and the other of which is connected to one of the terminals of the first low-voltage transistor LTR1. An operation of the second high-voltage transistor HTR2 may be controlled by a first bit line selection signal BLSLT1 applied to a gate of the second high-voltage transistor HTR2. The second high-voltage transistor HTR2 may be turned on or off by the first bit line selection signal BLSLT1. For example, the second high-voltage transistor HTR2 may be turned on in response to the first bit line selection signal BLSLT1 set to a logical high, and in this case, a voltage transmitted from the first low-voltage transistor LTR1 may be applied to the first bit line BL1. During a program operation, a voltage, which is applied to the first bit line BL1 through the second high-voltage transistor HTR2, may be a program inhibition voltage or a ground voltage. The second high-voltage transistor HTR2 may be turned off in response to the first bit line selection signal BLSLT1 set to a logical low, and in this case, the voltage transmitted from the first low-voltage transistor LTR1 is not applied to the first bit line BL1.

The second high-voltage transistor HTR2 may be a high-voltage transistor which is configured to prevent an unexpected high voltage from the first bit line BL1 from being transmitted to the first low-voltage transistor LTR1, to thereby prevent the breakdown of the first low-voltage transistor LTR1.

The first low-voltage transistor LTR1 includes two terminals, one of which is connected to the aforementioned other of the terminals of the second high-voltage transistor HTR2, and the other of which is connected to a line supplied with the first voltage V1. An operation of the first low-voltage transistor LTR1 may be controlled by a first control signal CTRL1 applied to a gate of the first low-voltage transistor LTR1. For example, the first low-voltage transistor LTR1 may control a magnitude of the first voltage V1 transmitted to the second high-voltage transistor HTR2 based on the first control signal CTRL1.

Alternatively, the first low-voltage transistor LTR1 may be turned on or off by the first control signal CTRL1. For example, the first low-voltage transistor LTR1 may be turned on in response to the first control signal CTRL1 set to a logical high, and in this case, the first low-voltage transistor LTR1 may be used to transmit the first voltage V1 to the second high-voltage transistor HTR2. Since the first voltage V1 transmitted to the first low-voltage transistor LTR1 is a low voltage, the first low-voltage transistor LTR1 may be a low-voltage transistor.

The second page buffer 122 includes a third high-voltage transistor HTR3 and a second low-voltage transistor LTR2. The third high-voltage transistor HTR3 includes two terminals, one of which is connected to the second bit line BL2, and the other of which is connected to one of terminals of the second low-voltage transistor LTR2. An operation of the third high-voltage transistor HTR3 may be controlled by a second bit line selection signal BLSLT2 applied to the gate of the third high-voltage transistor HTR3. For example, the third high-voltage transistor HTR3 may be turned on or off by the second bit line selection signal BLSLT2. The third high-voltage transistor HTR3 may be turned on in response to the second bit line selection signal BLSLT2 set to a logical high, and in this case, a voltage transmitted from the second low-voltage transistor LTR2 may be applied to the second bit line BL2. During a program operation, a voltage which is applied to the second bit line BL2 through the third high-voltage transistor HTR3 may be a program inhibition voltage or a ground voltage. The third high-voltage transistor HTR3 may be turned off in response to the second bit line selection signal BLSLT2 set to a logical low, and in this case, a voltage transmitted from the second low-voltage transistor LTR2 is not applied to the second bit line BL2. During an erase operation, the third high-voltage transistor HTR3 may be turned (switched) off to allow the second bit line BL2 to be in a floating state. In other words, the second page buffer 122 (or the page buffer circuit 120 in general) may be characterized as configured to place the second bit line BL2 in a floating state.

The third high-voltage transistor HTR3 may be a high-voltage transistor which is configured to prevent an unexpected high-voltage from the second bit line BL2 from being transmitted to the second low-voltage transistor LTR2, to thereby prevent the breakdown of the second low-voltage transistor LTR2.

The second low-voltage transistor LTR2 includes two terminals, one of which is connected to the aforementioned other of the terminals of the third high-voltage transistor HTR3, and the other of which is connected to a line supplied with the first voltage V1. An operation of the second low-voltage transistor LTR2 may be controlled by a second control signal CTRL2 applied to a gate of the second low-voltage transistor LTR2. For example, the second low-voltage transistor LTR2 may control a magnitude of the first voltage V1 transmitted to the third high-voltage transistor HTR3 based on the second control signal CTRL2.

In some embodiments, a magnitude of the voltage which is transmitted from the first low-voltage transistor LTR1 to the second high-voltage transistor HTR2 in accordance with the first control signal CTRL1, may be different from that of the voltage which is transmitted from the second low-voltage transistor LTR2 to the third high-voltage transistor HTR3 in accordance with the second control signal CTRL2.

The second low-voltage transistor LTR2 may be turned on or off by the second control signal CTRL2. For example, the second low-voltage transistor LTR2 may be turned on in response to the second control signal CTRL2 set to a logical high, and in this case, the second low-voltage transistor LTR2 may be used to transmit the first voltage V1 to the third high-voltage transistor HTR3. Since the first voltage V1 transmitted to the second low-voltage transistor LTR2 is a low voltage, the second low-voltage transistor LTR2 may be a low-voltage transistor.

The control signals V2_en, BLSLT1, CTRL1, BLSLT2, and CTRL2, which are provided to the first and second page buffers 121 and 122, may be transmitted from the control logic 140 of FIG. 2. The control logic 140 may control the first and second page buffers 121 and 122 using the control signals V2_en, BLSLT1, CTRL1, BLSLT2, and CTRL2.

As shown in FIG. 6, the second page buffer 122 does not have a transistor that can be used to provide the second voltage V2 to the second bit line BL2. Thus, if it is necessary to increase a voltage of the second bit line BL2 to the erase voltage, the coupling with the first bit line BL1 may be used to increase a voltage of the second bit line BL2 to the erase voltage. In other words, according to some embodiments of the inventive concepts, even when the second page buffer 122 does not include a transistor capable of applying the erase voltage to the second bit line BL2, the voltage of the second bit line BL2 may be elevated to the erase voltage, and thus, it may be possible to effectively perform the erase operation on the cell strings connected to the second bit line BL2. Thus, it may be possible to reduce a circuit area of the page buffer circuit 120 and to realize the erase operation using the bit line BL.

Figure 7:
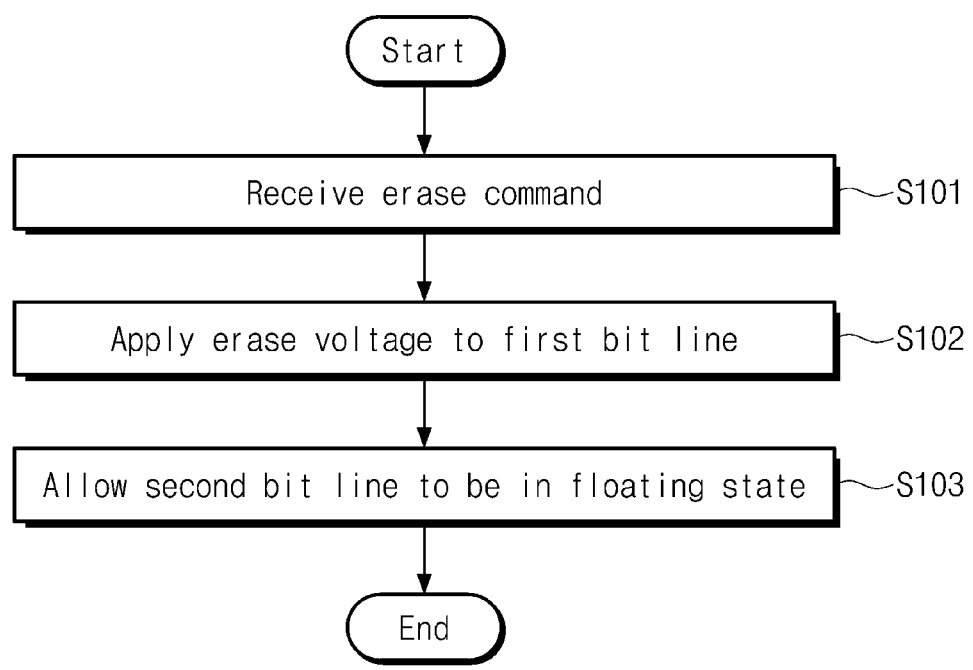
FIG. 7 illustrates a flow chart of an example of an erase operation of a memory device of FIG. 1.

FIG. 7 illustrates a flow chart of an example of an erase operation of a memory device of FIG. 1. Referring to FIG. 7, in step S101, the memory device 100 receives an erase command CMD from the memory controller 200. In step S102, the memory device 100 applies an erase voltage to a first bit line BL1 (such as bit line BL1 shown in FIG. 4 for example), based on the erase command CMD. In the case where the erase voltage is applied to the first bit line BL1, the memory cells of the cell string connected to the first bit line BL1 are directly erased by the erase voltage. In step S103, a second bit line BL2 (such as bit line BL2 shown in FIG. 4 for example) is electrically floated. The first bit line BL1 and the second bit line BL2 may be adjacent to each other. In some embodiments, at least one other bit line may be located between the first bit line BL1 and the second bit lines BL2. In a case where the second bit line BL2 is in a floating state and an erase voltage is applied to the first bit line BL1 at a same time, the second bit line BL2 may be coupled with the first bit line BL1 applied with the erase voltage. As a result of the coupling, a voltage of the second bit line BL2 may be elevated to the erase voltage. In the case where the erase voltage of the second bit line BL2 is transmitted to the cell string, the memory cells of the cell strings connected to the second bit line BL2 may also be effectively erased.

Figure 8:
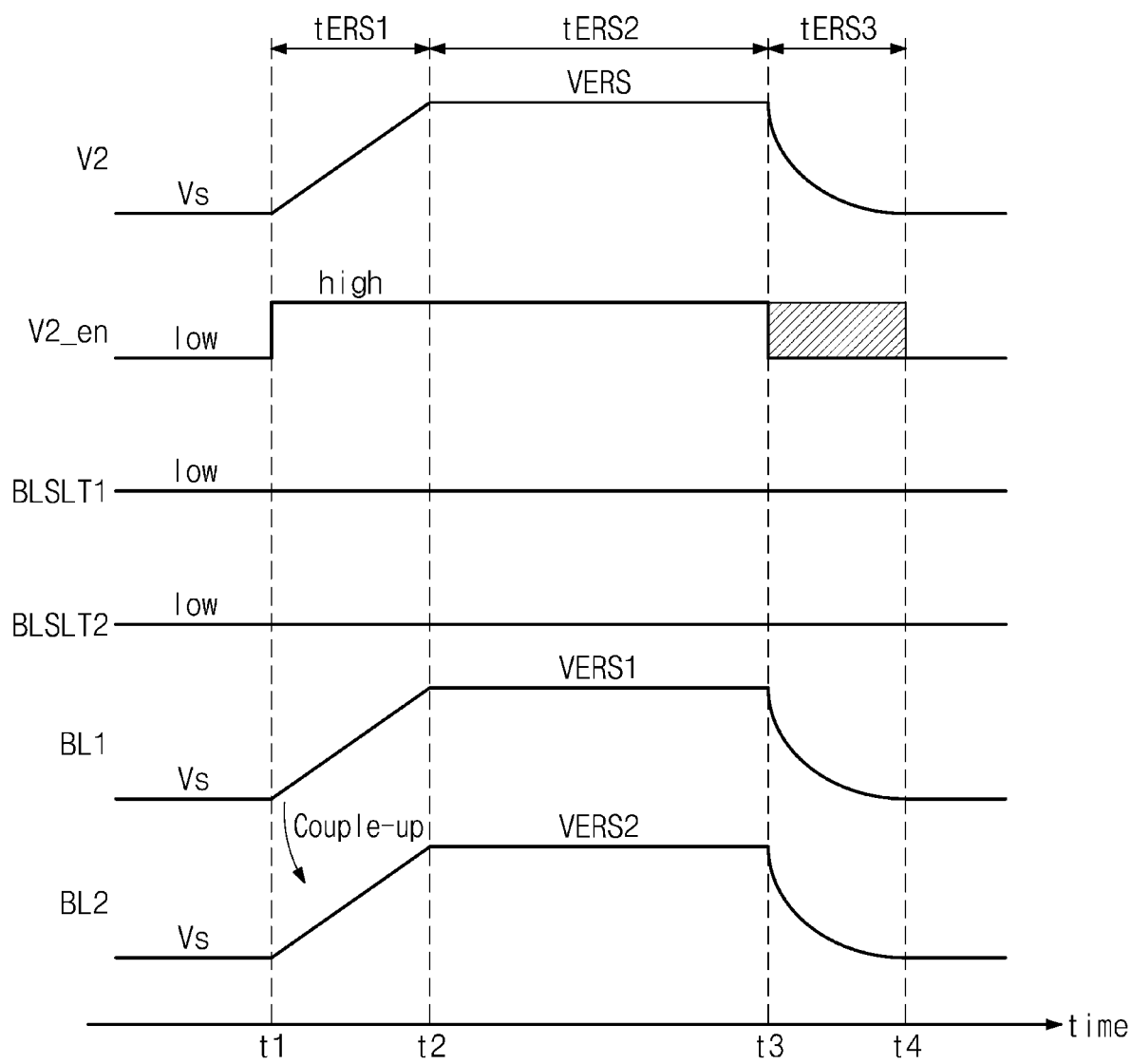
FIG. 8 illustrates a timing diagram of an example of the erase operation of FIG. 7.

FIG. 8 illustrates a timing diagram of an example of the erase operation of FIG. 7. The timing diagram of FIG. 8 is described hereinafter with reference to page buffer circuit 120 shown in FIG. 6. Referring to FIG. 8, the erase operation may be divided into a first erase period tERS1 from time t1 to time t2, a second erase period tERS2 from time t2 to time t3, and a third erase period tERS3 from time t3 to time t4.

The first erase period tERS1 as shown in FIG. 8 is a period for setting voltages of the first and second bit lines BL1 and BL2 to the erase voltage VERS. In other words, the first erase period tERS1 is a setup period for the erase operation. In the first erase period tERS1, the second voltage V2 is changed from a start voltage Vs to the erase voltage VERS. The start voltage Vs may be, for example, 0V. The second voltage enable signal V2_en is changed from a logical low to a logical high. Thus, the first high-voltage transistor HTR1 of the first page buffer 121 is turned on to allow the second voltage V2 to be applied to the first bit line BL1.

In the first erase period tERS1, the first bit line selection signal BLSLT1 and the second bit line selection signal BLSLT2 are set to a logical low. Accordingly, the second high-voltage transistor HTR2 of the first page buffer 121 and the third high-voltage transistor HTR3 of the second page buffer 122 are turned off to prevent the first voltage V1 to be supplied to the first bit line BL1 and the second bit line BL2. In the first erase period tERS1, a voltage of the first bit line BL1 is changed from the start voltage Vs to a first erase voltage VERS1, in accordance with the second voltage V2. The second bit line BL2 may be coupled with the first bit line BL1, as indicated by "Couple-up" in FIG. 8. As a result of the coupling, a voltage of the second bit line BL2 may be changed from the start voltage Vs to a second erase voltage VERS2.

The second erase period tERS2 is a period in which the erase operation is performed using the erase voltage VERS set during the first erase period tERS1. In other words, the second erase period tERS2 is an execution period for the erase operation. During the second erase period tERS2, the second voltage V2, the control signals V2_en, BLSLT1, and BLSLT2, and voltage levels of the first and second bit lines BL1 and BL2 are maintained at the same respective levels as at the final stage of the first erase period tERS1. In other words, during the second erase period tERS2, the second bit line BL2 is in a floating state.

The third erase period tERS3 is a period in which bias voltages used for the erase operation are decreased to the start state of the first erase period tERS1. In other words, the third erase period tERS3 is a recovery period for the erase operation. In the third erase period tERS3, the second voltage V2 is decreased. As a result of the decrease or supply interruption of the second voltage V2, the first bit line BL1 may be discharged. In the case where the first bit line BL1 is discharged, the second bit line BL2 coupled therewith may be discharged. In the third erase period tERS3, the second voltage enable signal V2_en may be set to one of a logical low and a logical high.

As shown in FIG. 8, the erase operation including the first to third erase periods tERS1-tERS3 may be performed to erase data, which are stored in the memory cells of the cell strings connected to the first and second bit lines BL1 and BL2.

Figure 9A:
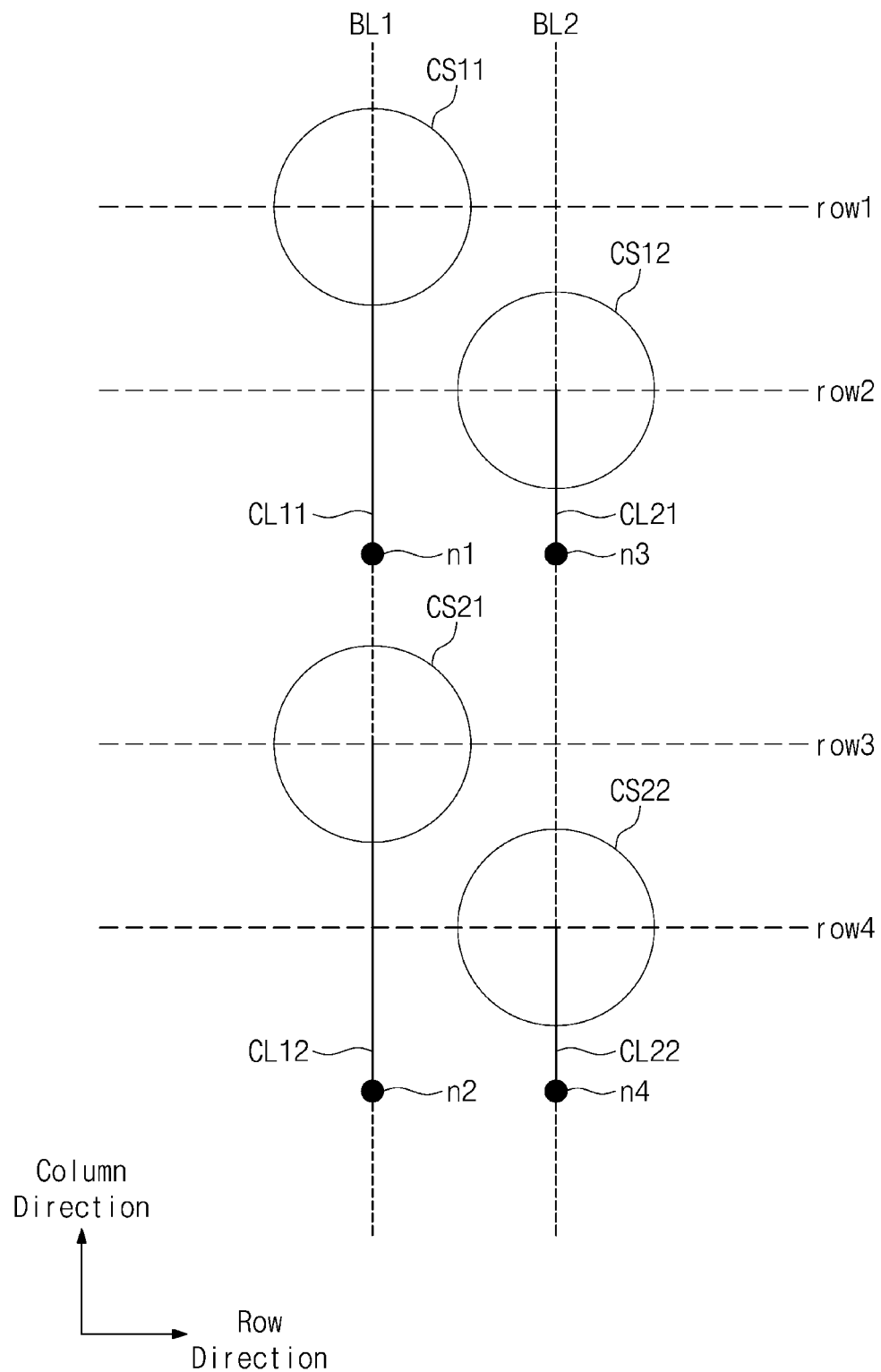
FIG. 9A illustrates a top plan view of a connection structure between cell strings and bit lines, according to an embodiment of the inventive concepts.
Figure 9B:
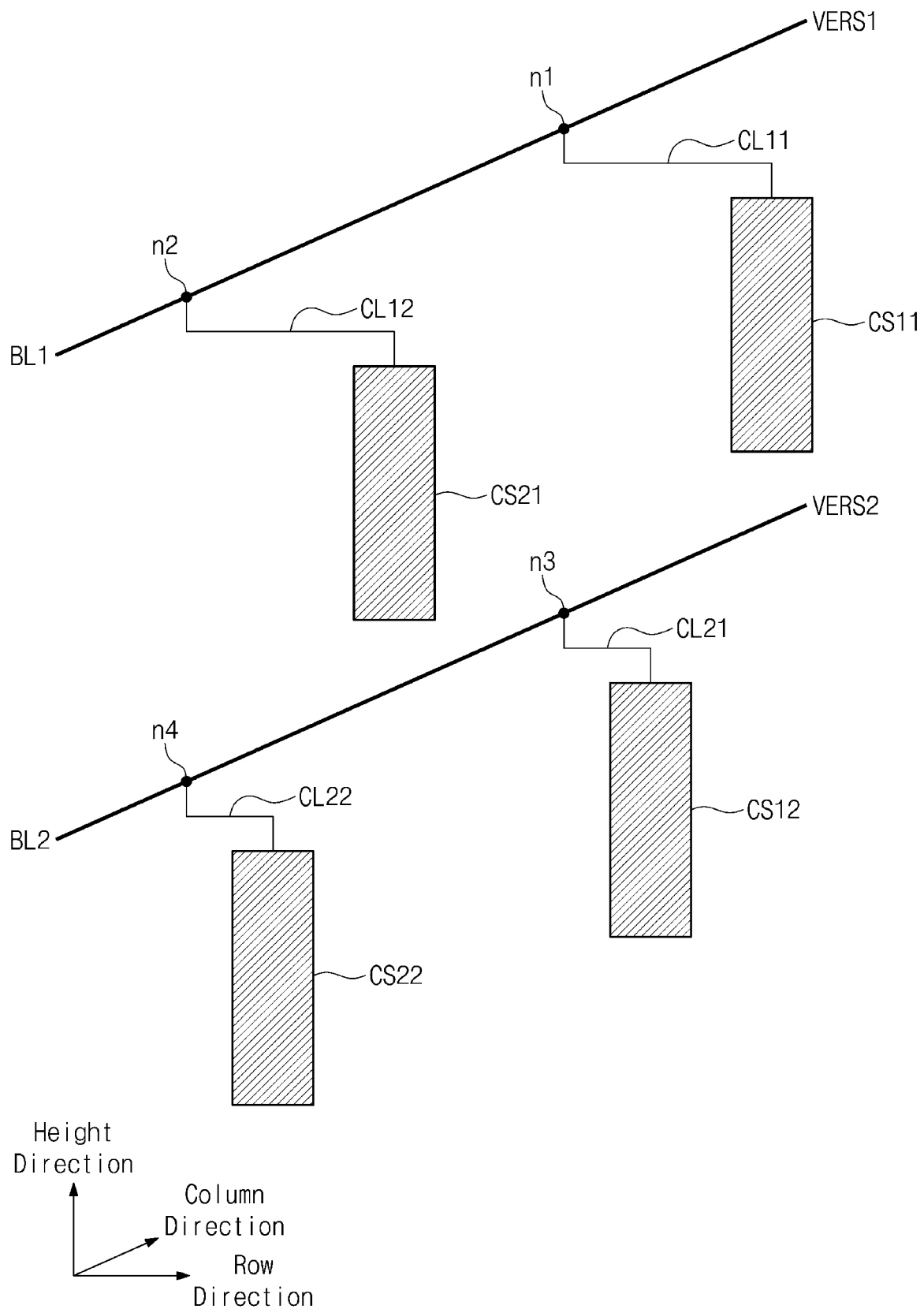
FIG. 9B illustrates a perspective view of the connection structure between cell strings and bit lines of FIG. 9A, according to an embodiment of the inventive concepts.

FIGS. 9A and 9B are diagrams illustrating a connection structure between cell strings and bit lines, according to an embodiment of the inventive concepts. In detail, FIG. 9A is a top plan view illustrating the first and second bit lines BL1 and BL2 extending in a column direction and the cell strings CS11, CS12, CS21, and CS22 provided below the first and second bit lines BL1 and BL2, and FIG. 9B is a perspective view schematically illustrating the structure of FIG. 9A.

Referring to FIG. 9A, the first bit line BL1 is connected to the first cell string CS11 through a connection line CL11 and is connected to the second cell string CS21 through a connection line CL12. One terminal of the connection line CL11 is connected to a first node n1 of the first bit line BL1, and one terminal of the connection line CL12 is connected to a second node n2 of the first bit line BL1.

The second bit line BL2 is connected to the first cell string CS12 through a connection line CL21 and is connected to the second cell string CS22 through a connection line CL22. One terminal of the connection line CL21 is connected to a third node n3 of the second bit line BL2, and one terminal of the connection line CL22 is connected to a fourth node n4 of the second bit line BL2.

To increase an integration density of the cell array 110 or to improve the efficiency in arrangement of the cell strings, positions of the cell strings CS11 and CS21 connected to the first bit line BL1 are different from positions of the cell strings CS12 and CS22 connected to the second bit line BL2, when considered with respect to the column direction. As shown in FIG. 9A, the first cell string CS11 is placed in a first row (row1), and the first cell string CS12 is placed in a second row (row2). The second cell string CS21 is placed in a third row (row3), and the second cell string CS22 is placed in a fourth row (row4). That is, the positions of the cell strings CS11 and CS21 connected to the first bit line BL1 are shifted from those of the cell strings CS12 and CS22 connected to the second bit line BL2 by a length smaller than a distance between the cell strings CS11 and CS21 in the column direction.

Referring to FIG. 9B, the first bit line BL1 is connected to the first and second cell strings CS11 and CS21 through the connection lines CL11 and CL12, and the second bit line BL2 is connected to the first and second cell strings CS12 and CS22 through the connection lines CL21 and CL22. In this case, each of the cell strings CS11, CS12, CS21, and CS22 extend in the height direction.

In the case where the cell strings CS11, CS21, CS12, and CS22 are provided as shown in FIGS. 9A and 9B, the connection lines CL11 and CL12 are longer than the connection lines CL21 and CL22. Since the connection lines CL11 and CL12 are longer than the connection lines CL21 and CL22, electric resistances of the connection lines CL11 and CL12 may be higher than those of the connection lines CL21 and CL22. Accordingly, a magnitude of a voltage which is transmitted to the first and second cell strings CS11 and CS21 through the first bit line BL1 may be lower than a magnitude of a voltage which is transmitted to the first and second cell strings CS12 and CS22 through the second bit line BL2. Thus, the memory cells included in the first and second cell strings CS11 and CS21 may serve as slow cells, whereas the memory cells included in the first and second cell strings CS12 and CS22 may serve as fast cells.

During the erase operation, the first page buffer 121 such as shown in FIG. 6 may apply the first erase voltage VERS1 to the first bit line BL1. Since the second bit line BL2 is electrically coupled with the first bit line BL1 applied with the first erase voltage VERS1, a voltage of the second bit line BL2 may be increased to the second erase voltage VERS2.

In some embodiments, the second erase voltage VERS2 may be lower than the first erase voltage VERS1. In the case where the connection lines CL11 and CL12 have lengths that are substantially equal to those of the connection lines CL21 and CL22 and the second erase voltage VERS2 is lower than the first erase voltage VERS1, the difference between the first erase voltage VERS1 and the second erase voltage VERS2 may lead to non-uniformity in electrical or data states of the erased memory cells. However, in the case where, as shown in FIGS. 9A and 9B, the connection lines CL11 and CL12 are longer than the connection lines CL21 and CL22, it may be possible to reduce a difference between voltages which are transmitted to the cell strings CS11, CS21, CS12, and CS22 through the connection lines CL11-CL22, even when the first erase voltage VERS1 is higher than the second erase voltage VERS2. That is, the arrangement of the cell strings CS11, CS21, CS12, and CS22 shown in FIGS. 9A and 9B may reduce a variation in magnitude between the erase voltages applied to the cell strings CS11, CS21, CS12, and CS22.

A page buffer which is connected to a long connection line (e.g., the connection lines CL11 and CL12 of FIGS. 9A and 9B) through a bit line, may include a high-voltage transistor (e.g., the first high-voltage transistor HTR1 of the first page buffer 121 of FIG. 6) to which the erase voltage (i.e., the second voltage V2) can be applied. On the other hand, a page buffer which is connected to a short connection line (e.g., the connection lines CL21 and CL22 of FIGS. 9A and 9B) through a bit line, may not include a high-voltage transistor (e.g., the first high-voltage transistor HTR1) to which the erase voltage (i.e., the second voltage V2) can be applied. That is, for a cell string in which a memory cell serving as the slow cell is included, the second voltage V2 may be directly used as an erase voltage, whereas for another cell string, in which a memory cell serving as the fast cell is included, a voltage which is provided by the coupling between the bit lines may be used as an erase voltage.

Figure 10:
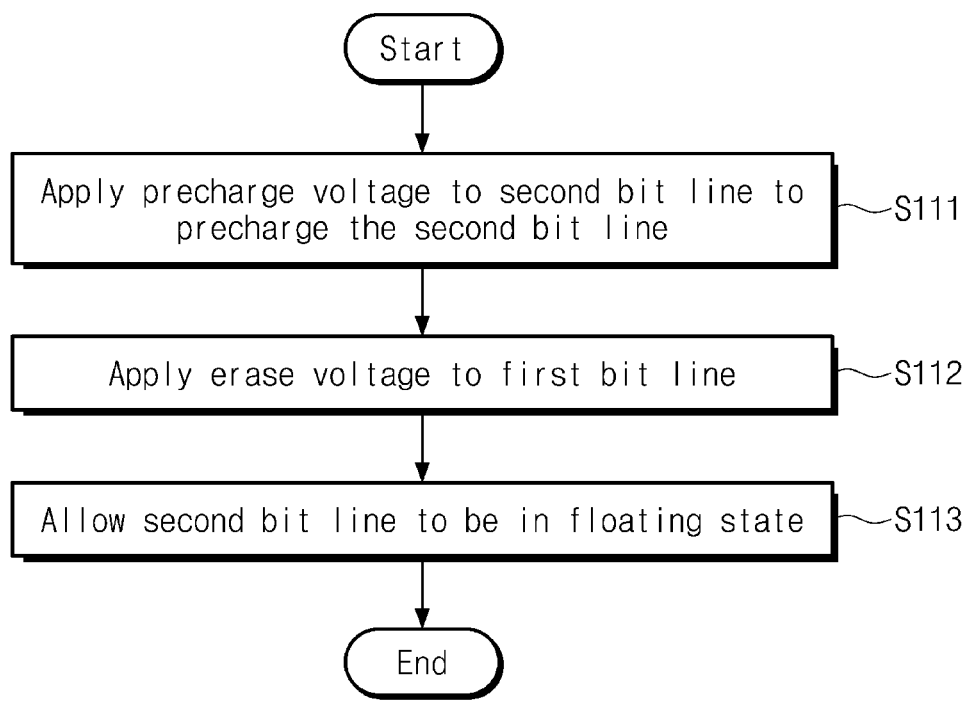
FIG. 10 illustrates a flow chart of another example of an erase operation of a memory device of FIG. 1.

FIG. 10 illustrates a flow chart of another example of an erase operation of a memory device of FIG. 1. In step S111, the memory device 100 applies a precharge voltage to the second bit line BL2 to precharge the second bit line BL2. The precharge voltage may be a voltage which is produced from the first voltage V1. For example, second page buffer 122 as shown in FIGS. 4 and 6 may apply the precharge voltage. In step S112, the memory device 100 applies an erase voltage to the first bit line BL1. For example, first page buffer 121 as shown in FIGS. 4 and 6 may apply the erase voltage. In the case where the erase voltage is applied to the first bit line BL1, the memory cells of the cell string connected to the first bit line BL1 may be directly erased by the erase voltage applied to the first bit line BL1. In step S113, the second bit line BL2 is electrically floated. In the case where the second bit line BL2 is in the floating state, the second bit line BL2 may be coupled with the first bit line BL1 to which the erase voltage is applied. As a result of the coupling, a voltage of the second bit line BL2 may be increased to an erase voltage. In the case where the erase voltage of the second bit line BL2 is transmitted to the cell string, the memory cells of the cell strings connected to the second bit line BL2 may also be effectively erased.

Figure 11:
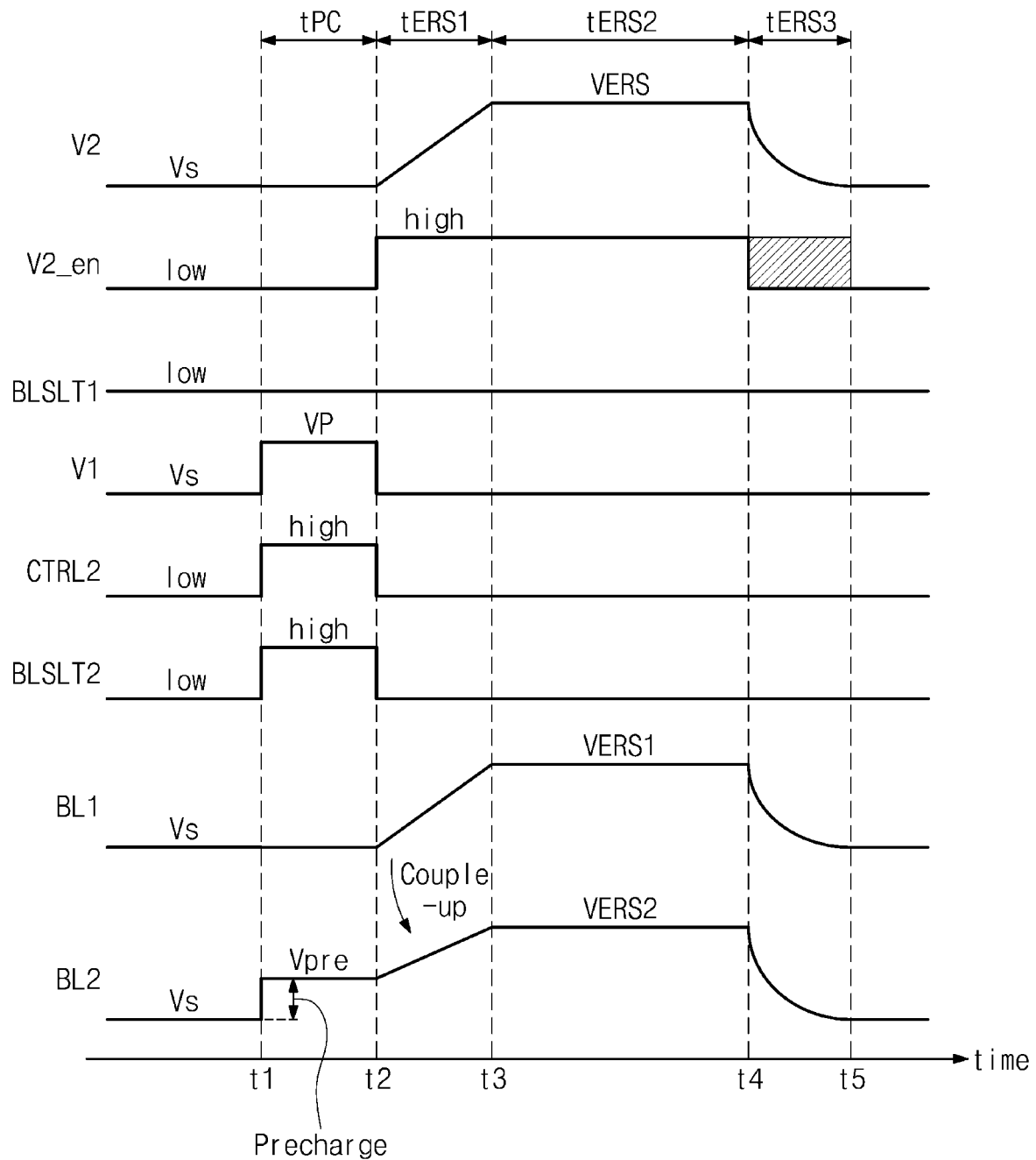
FIG. 11 illustrates a timing diagram of an example of the erase operation of FIG. 10.

FIG. 11 illustrates a timing diagram of an example of the erase operation of FIG. 10. Referring to FIG. 11, the erase operation is divided into a precharge period tPC from time t1 to time t2, the first erase period tERS1 from time t2 to time t3, the second erase period tERS2 from time t3 to time t4, and the third erase period tERS3 from time t4 to time t5.

In the case where a voltage of the second bit line BL2 is determined through coupling with the first bit line BL1 applied with the erase voltage, there may be a difference in magnitude between the first bit line BL1 and the second bit line BL2. For example, the erase voltage of the second bit line BL2 may be lower than the erase voltage of the first bit line BL1. To reduce such a difference between the erase voltages, the second bit line BL2 is pre-charged to a pre-charge voltage Vpre in the precharge period tPC.

In the precharge period tPC, the first voltage V1, the second bit line selection signal BLSLT2, and the second control signal CTRL2 are provided to the second page buffer 122 shown in FIG. 6. For example, the first voltage V1 provided to the second page buffer 122 may be a particular voltage VP, and the second bit line selection signal BLSLT2 and the second control signal CTRL2 may be set to a logical high. The second page buffer 122 produces the precharge voltage Vpre from the first voltage V1 in response to the second control signal CTRL2. The second page buffer 122 applies the precharge voltage Vpre to the second bit line BL2 in response to the second bit line selection signal BLSLT2. Thus, the second bit line BL2 may be pre-charged to the precharge voltage Vpre. For example, a magnitude of the precharge voltage Vpre may be substantially equal to a difference between the first and second erase voltages VERS1 and VERS2, when the second bit line BL2 is not pre-charged.

Operations in the first to third erase periods tERS1-tERS3 may be similar to those in the first to third erase periods tERS1-tERS3 of FIG. 8, and thus, a detailed description thereof will be omitted. In the first erase period tERS1, the second voltage V2 may be set to the erase voltage VERS, and thus, a voltage of the first bit line BL1 may be set to the first erase voltage VERS1. A voltage of the second bit line BL2, which is in a pre-charged state, may be set to the second erase voltage VERS2, owing to the coupling between the first and second bit lines BL1 and BL2. In this case, the first erase voltage VERS1 may be substantially equal to the second erase voltage VERS2. Next, the erase operation is performed in the second erase period tERS2, and bias voltages used for the erase operation are decreased in the third erase period tERS3.

As shown in FIG. 11, the memory device 100 may apply the precharge voltage Vpre to the second bit line BL2, before applying the first erase voltage VERS1 to the first bit line BL1, for the erase operation. This may allow the erase voltages VERS1 and VERS2, which are respectively applied to the first and second bit lines BL1 and BL2, to have substantially the same level.

FIG. 11 illustrates an example, in which a precharge operation is performed to reduce a difference between the erase voltages VERS1 and VERS2, but the inventive concepts are not limited as described. For example, a magnitude of the precharge voltage Vpre may be variously changed. For example, a magnitude of the precharge voltage Vpre may be larger than a difference between the first and second erase voltages VERS1 and VERS2, when the second bit line BL2 is not pre-charged. In this case, the second erase voltage VERS2 produced by the coupling may be higher than the first erase voltage VERS1 of the first bit line BL1. Furthermore, in the case where the first voltage V1 is a negative voltage, the second bit line BL2 may be pre-charged to a negative voltage. That is, the precharge voltage Vpre may become a negative voltage.

Figure 12:
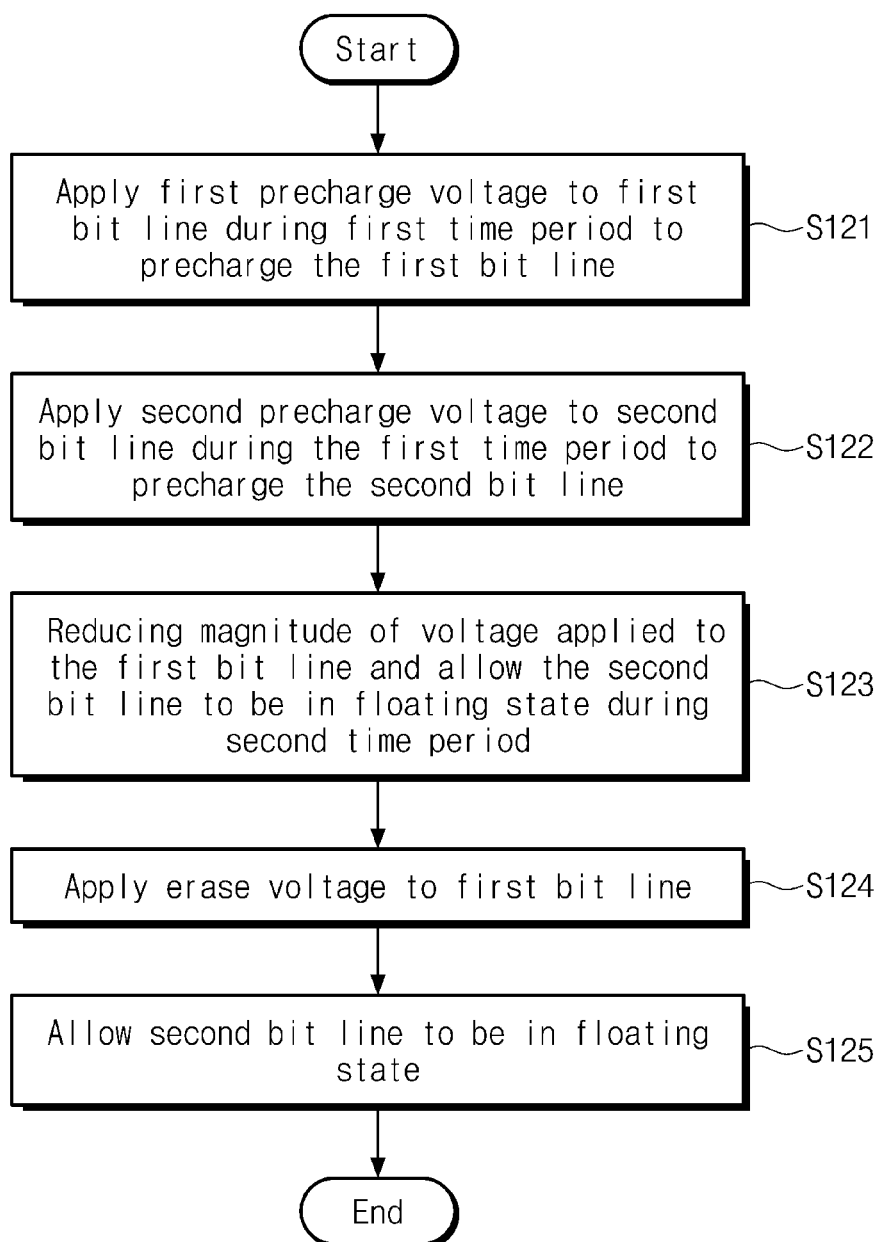
FIG. 12 illustrates a flow chart of another example of an erase operation of a memory device of FIG. 1.

FIG. 12 illustrates a flow chart of another example of an erase operation of a memory device of FIG. 1. In step S121, the memory device 100 applies a first precharge voltage to the first bit line BL1 to precharge the first bit line BL1, during a first time period. For example, first page buffer 121 as shown in FIGS. 4 and 6 may apply the first precharge voltage. In step S122, the memory device 100 applies a second precharge voltage to the second bit line BL2 to precharge the second bit line BL2, during a first time period. For example, second page buffer 122 as shown in FIGS. 4 and 6 may apply the second precharge voltage. For example, the second precharge voltage may be lower than the first precharge voltage.

In step S123, the memory device 100 reduces a magnitude of a voltage applied to the first bit line BL1 and allows the second bit line BL2 to be in a floating state, during a second time period. For example, the memory device 100 may reduce a magnitude of the voltage which is provided to the first bit line BL1 from the first precharge voltage to the ground voltage Vss, and may stop the voltage from being supplied to the second bit line BL2. In the case where the voltage of the first bit line BL1 is lowered from the first precharge voltage to the ground voltage Vss and the supply of the second precharge voltage to the second bit line BL2 is stopped, the coupling allows the second bit line BL2 to have a voltage that is lowered by a difference between the first precharge voltage and the ground voltage Vss. In this case, the voltage of the second bit line BL2 may be lowered from the second precharge voltage to a negative voltage, owing to the coupling-induced voltage lowering. In other words, the second bit line BL2 may be pre-charged to a negative voltage, owing to the coupling.

In step S124, the memory device 100 applies an erase voltage to the first bit line BL1. In the case where the erase voltage is applied to the first bit line BL1, the memory cells of the cell string connected to the first bit line BL1 are directly erased by the erase voltage applied to the first bit line BL1. In step S125, the second bit line BL2 is electrically floated. In the case where the second bit line BL2 is in the floating state, the second bit line BL2 may be coupled with the first bit line BL1 to which the erase voltage is applied. As a result of the coupling, a voltage of the second bit line BL2 may be increased to an erase voltage. In the case where the erase voltage of the second bit line BL2 is transmitted to the cell string, the memory cells of the cell strings connected to the second bit line BL2 may also be effectively erased.

Figure 13:
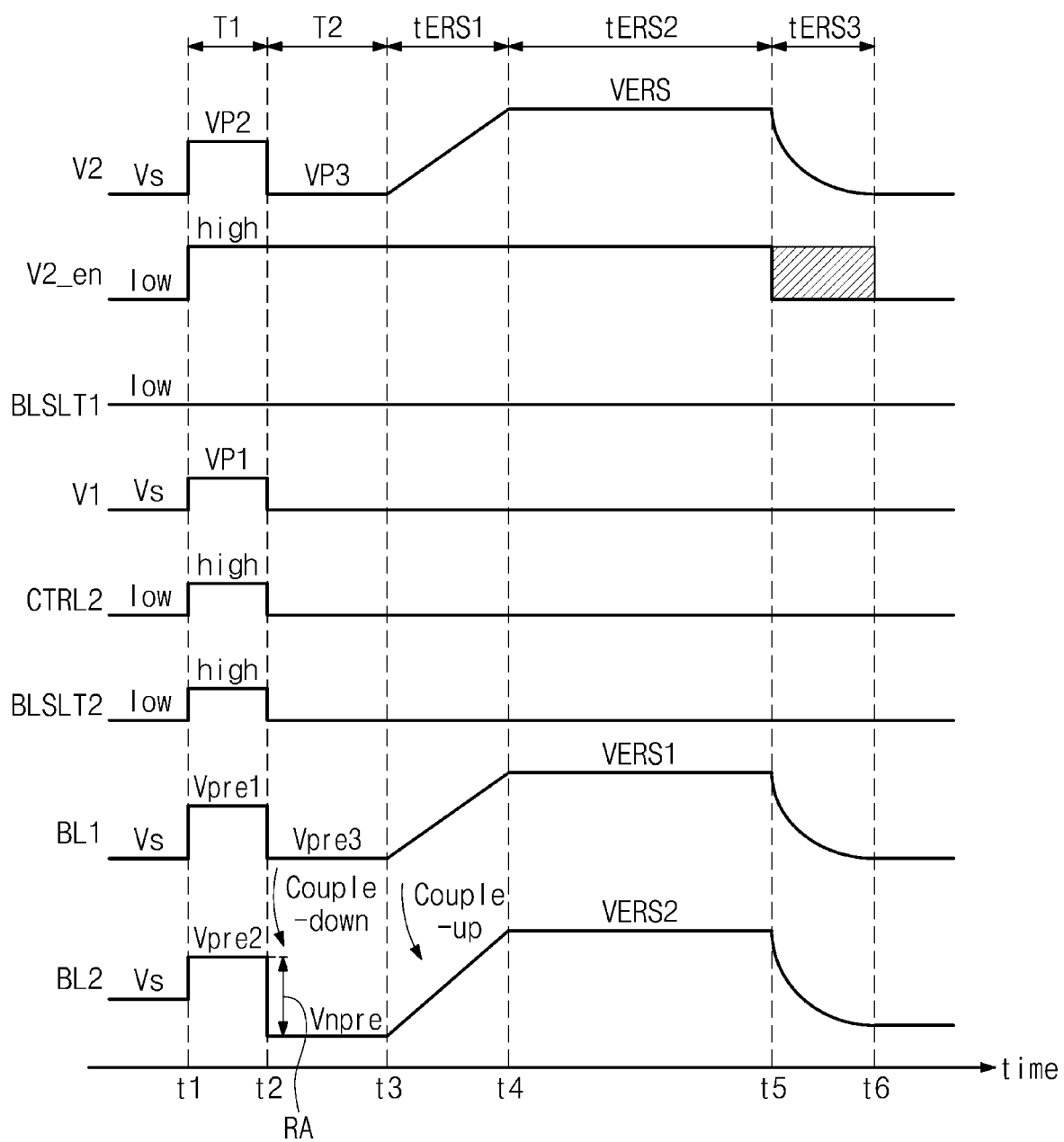
FIG. 13 illustrates a timing diagram of an example of the erase operation of FIG. 12.

FIG. 13 illustrates a timing diagram of an example of the erase operation of FIG. 12. Referring to FIG. 13, the erase operation is divided into a first time period T1 from time t1 to time t2, a second time period T2 from time t2 to time t3, the first erase period tERS1 from t3 to time t4, the second erase period tERS2 from time t4 to time t5, and the third erase period tERS3 from time t5 to time t6.

In the case where a voltage of the second bit line BL2 is determined through coupling with the first bit line BL1 applied with the erase voltage, there may be a difference in voltage level between of the first bit line BL1 and the second bit line BL2. In certain cases, the erase voltage of the second bit line BL2 may be higher than the erase voltage of the first bit line BL1. To reduce the difference between the erase voltages, in the first and second time periods T1 and T2, the second bit line BL2 may be negatively pre-charged to a negative precharge voltage Vnpre. In other words, the second bit line BL2 may be pre-charged to a voltage that is lower than the start voltage Vs or the ground voltage Vss.

In the first time period T1, the second voltage V2 and the second voltage enable signal V2_en are provided to the first page buffer 121 as shown in FIGS. 4 and 6. For example, the second voltage V2 may be a second particular voltage VP2 lower than the erase voltage VERS, and the second voltage enable signal V2_en may be set to a logical high. The first page buffer 121 applies a first precharge voltage Vpre1 to the first bit line BL1 in response to the second voltage enable signal V2_en. Here, the first precharge voltage Vpre1 may be substantially the same as the second particular voltage VP2. Thus, the first bit line BL1 may be pre-charged to the first precharge voltage Vpre1.

In the first time period T1, the first voltage V1, the second bit line selection signal BLSLT2, and the second control signal CTRL2 are provided to the second page buffer 122. For example, the first voltage V1 may be a first particular voltage VP1, and the second bit line selection signal BLSLT2 and the second control signal CTRL2 may be set to logical high. The second page buffer 122 produces a second precharge voltage Vpre2 from the first particular voltage VP1 in response to the second control signal CTRL2. The second page buffer 122 applies the second precharge voltage Vpre2 to the second bit line BL2 in response to the second bit line selection signal BLSLT2. Thus, the second bit line BL2 may be pre-charged to the second precharge voltage Vpre2.

In the second time period T2, a magnitude of the second voltage V2 provided to the first page buffer 121 is lowered to a third particular voltage VP3, and the logical high state of the second voltage enable signal V2_en is maintained. For example, the third particular voltage VP3 may be the ground voltage Vss or the start voltage Vs. Thus, a voltage of the first bit line BL1 is lowered from the first precharge voltage Vpre1 to a third precharge voltage Vpre3. In this case, the third precharge voltage Vpre3 may be substantially equal to the third particular voltage VP3. A difference in magnitude between the second and third particular voltages VP2 and VP3 may be substantially equal to a change RA in voltage of the second bit line BL2 (e.g., from the second precharge voltage Vpre2 to the negative precharge voltage Vnpre), which is caused by the coupling.

In the second time period T2, the supply of the voltage to be provided to the second bit line BL2 is stopped. In other words, the second bit line BL2 may be in a floating state. For example, the second bit line selection signal BLSLT2 provided to the second page buffer 122 may be set to logical low.

In the case where the voltage provided to the first bit line BL1 is lowered from the first precharge voltage Vpre1 to the third precharge voltage Vpre3 and the supply of the second precharge voltage Vpre2 to the second bit line BL2 is stopped, the second bit line BL2, which is coupled to the first bit line BL1, may be pre-charged to a negative voltage, owing to the change in voltage of the first bit line BL1. In other words, the voltage of the second bit line BL2 may be lowered, from the second precharge voltage Vpre2 to the negative precharge voltage Vnpre, by the coupling-induced lowered magnitude RA.

Operations in the first to third erase periods tERS1-tERS3 may be similar to those in the first to third erase periods tERS1-tERS3 of FIG. 8, and thus, a detailed description thereof will be omitted. In the first erase period tERS1, the second voltage V2 may be set to the erase voltage VERS, and thus, a voltage of the first bit line BL1 may be set to the first erase voltage VERS1. A voltage of the second bit line BL2, which is pre-charged to a negative voltage, may be set to the second erase voltage VERS2, owing to the coupling between the first and second bit lines BL1 and BL2. In this case, the first erase voltage VERS1 may be substantially equal to the second erase voltage VERS2.

Next, the erase operation is performed in the second erase period tERS2, and bias voltages used for the erase operation are decreased in the third erase period tERS3.

As shown in FIG. 13, the memory device 100 may precharge the second bit line BL2 to a negative voltage, before applying the first erase voltage VERS1 to the first bit line BL1 for the erase operation. This may allow the erase voltages VERS1 and VERS2 of the first and second bit lines BL1 and BL2 to have substantially the same level.

A negative pre-charging method is not limited to the method of FIG. 13, and various methods may be used to precharge the second bit line BL2 to a negative voltage. For example, the first voltage V1, instead of the second voltage V2, may be used to reduce the voltage of the first bit line BL1 to the third precharge voltage Vpre3.

Figure 14:
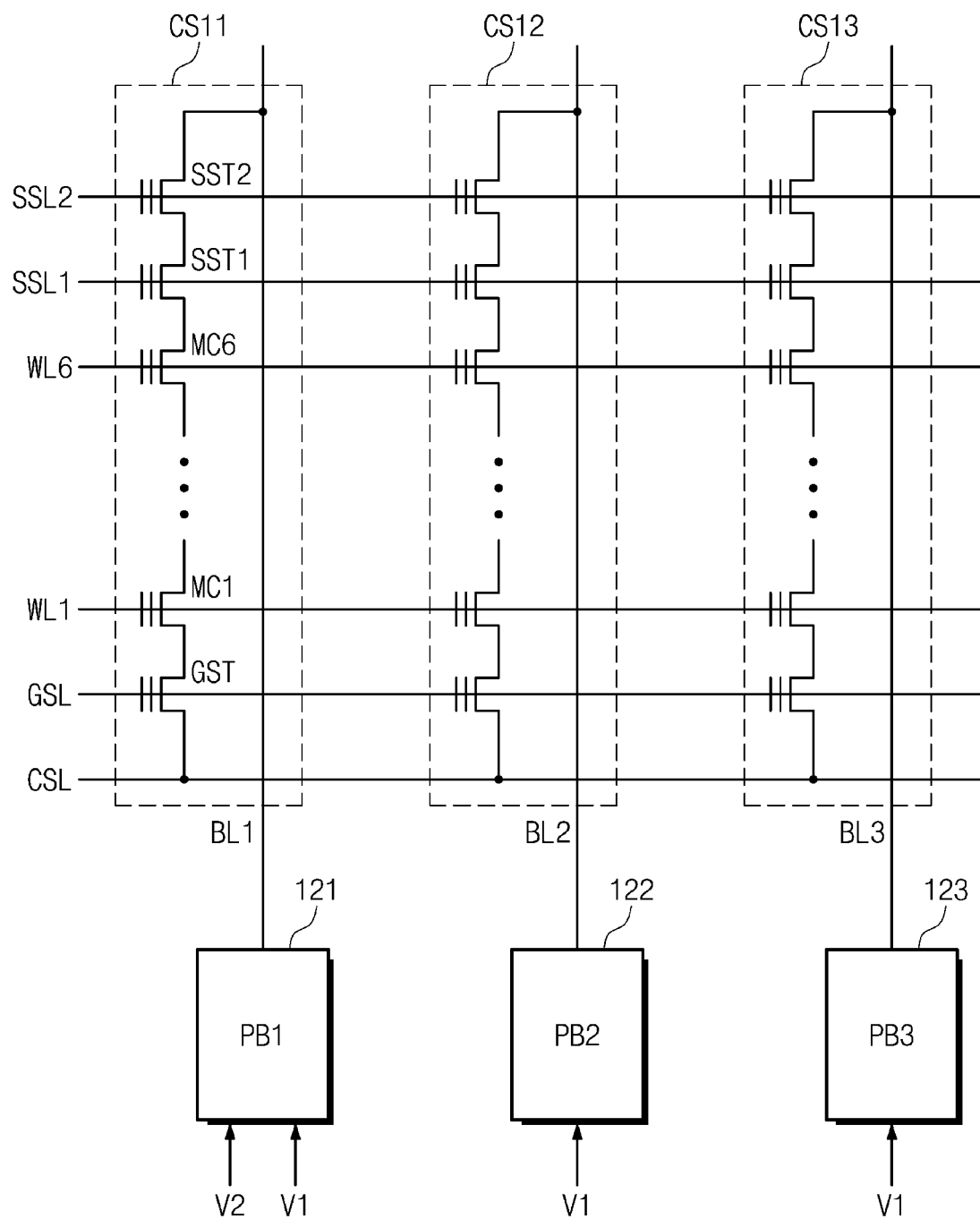
FIG. 14 illustrates a diagram of another example of the connection structure between the page buffers and the cell strings.

FIG. 14 illustrates a diagram of another example of the connection structure between the page buffers and the cell strings. Referring to FIG. 14, the page buffer circuit 120 of this embodiment includes first page buffer 121, second page buffer 122 and third page buffer 123. The first page buffer 121 is connected to the first cell string CS11 through the first bit line BL1, the second page buffer 122 is connected to the second cell string CS12 through the second bit line BL2, and the third page buffer 123 is connected to a third cell string CS13 through a third bit line BL3.

During an erase operation, the first page buffer 121 may be configured to receive the second voltage V2 and to apply an erase voltage, which is produced using the received second voltage V2, to the first bit line BL1. In the case where the second and third bit lines BL2 and BL3 are in a floating state, the voltages of the second and third bit lines BL2 and BL3 may be increased to the erase voltage, which is caused by the coupling.

As shown in FIG. 14, during the erase operation of the memory device 100, an erase voltage applied to the first bit line BL1 may be used to increase voltages of the second and third bit lines BL2 and BL3 to respective erase voltages. In other words, a single bit line applied with an erase voltage may be coupled with a plurality of bit lines to increase a voltage of each bit line to an erase voltage.

Figure 15:
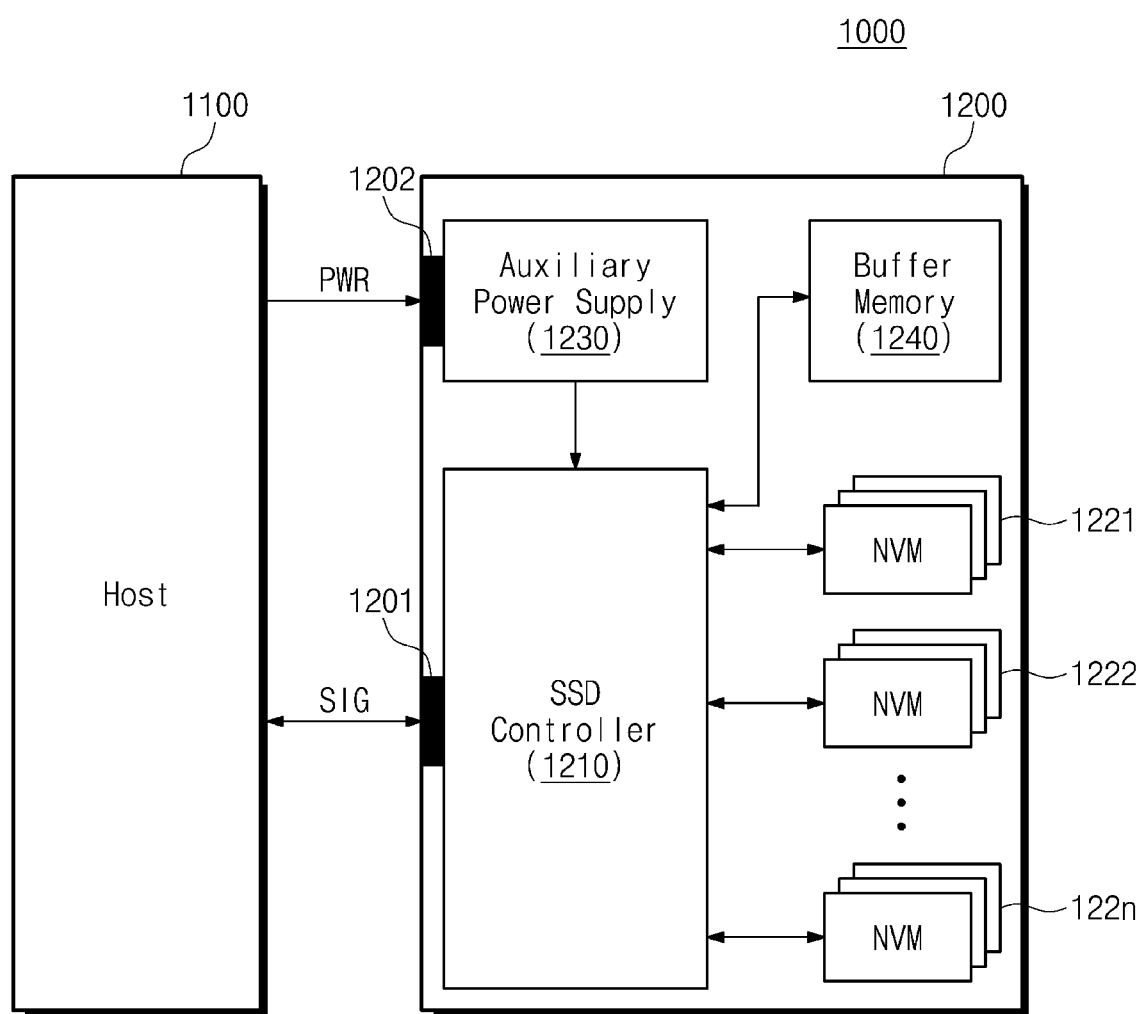
FIG. 15 illustrates a block diagram of a solid-state drive (SSD) system, in which a memory device according to embodiments of the inventive concepts is provided.

FIG. 15 illustrates a block diagram of a solid-state drive (SSD) system, in which a memory device according to an embodiment of the inventive concepts is provided. Referring to FIG. 15, an SSD system 1000 may include a host 1100 and an SSD 1200.

The SSD 1200 may exchange a signal SIG with the host 1100 through a signal connector 1201 and may be supplied with power PWR through a power connector 1202. The SSD 1200 includes an SSD controller 1210, a plurality of flash memories 1221, 1222-122n (which may hereinafter be referred to as flash memories 1221-122n), an auxiliary power supply 1230, and a buffer memory 1240. In some embodiments, each of the flash memories 1221-122n may be provided as an individual chip or an individual package.

The SSD controller 1210 may control the flash memories 1221-122n in response to the signal SIG received from the host 1100. The flash memories 1221-122n may operate under control of the SSD controller 1210. The auxiliary power supply 1230 may be connected to the host 1100 through the power connector 1202. In some embodiments, each of the flash memories 1221-122n may include one of the page buffers described with reference to FIGS. 1 to 14. The page buffer may be used to perform an erase operation on each of the flash memories 1221-122n.

The auxiliary power supply 1230 may be charged by the power PWR from the host 1100. In the case where there is a difficulty associated with the supply of the power PWR from the host 1100, the auxiliary power supply 1230 may supply electric power to the SSD 1200.

According to some embodiments of the inventive concepts, it may be possible to provide a three-dimensional nonvolatile memory device, in which an erase operation is performed using a method other than the bulk erase method, and which is configured to have a reduced chip area.

While example embodiments of the inventive concepts have been particularly shown and described, it should be understood by one of ordinary skill in the art that variations in form and detail may be made therein without departing from the spirit and scope of the inventive concepts.

What is claimed is:

1. A memory device, comprising:
   a cell array including a first cell string and a second cell string respectively connected to a first bit line and a second bit line; and
   a page buffer circuit configured to apply an erase voltage greater than 0 v to the first bit line and to place the second bit line in a floating state at a same time the erase voltage is applied to the first bit line by the page buffer circuit, when an erase operation is performed on memory cells of the first and second cell strings.

2. The memory device of claim 1, wherein the page buffer circuit comprises:
   a first page buffer including a first transistor configured to apply the erase voltage to the first bit line in response to a first control signal; and
   a second page buffer configured to prevent the erase voltage from being applied to the second bit line.

3. The memory device of claim 2, wherein the first page buffer further comprises a second transistor configured to apply a program inhibition voltage to the first bit line in response to a second control signal, and
   the second page buffer comprises a third transistor, which is configured to apply the program inhibition voltage to the second bit line in response to a third control signal.

4. The memory device of claim 3, further comprising a controller configured to control operations of the first and second page buffers using the first to third control signals,
   wherein the controller is configured to use the first and second control signals to control the first page buffer to apply the erase voltage to the first bit line,
   wherein the first control signal switches the first transistor to an on state, and the second control signal switches the second transistor to an off state.

5. The memory device of claim 4, wherein the controller is configured to control the second page buffer using the third control signal to place the second bit line in the floating state, wherein the third control signal switches the third transistor to an off state.

6. The memory device of claim 1, wherein the second bit line is coupled to the erase voltage applied to the first bit line.

7. The memory device of claim 1, wherein a length of a first connection line connecting the first bit line to the first cell string is different from a length of a second connection line connecting the second bit line to the second cell string.

8. The memory device of claim 1, wherein the page buffer circuit is further configured to perform a precharging operation on the second bit line, before applying the erase voltage to the first bit line.

9. The memory device of claim 8, wherein the precharging operation of the second bit line precharges the second bit line to a negative voltage.

10. A method of operating a memory device including a controller that provides control signals to a page buffer circuit, and including a first cell string and a second cell string respectively connected to a first bit line and a second bit line, the method comprising:
   receiving, by the controller, an erase command for an erase operation of memory cells included in the first cell string and the second cell string and providing the control signals responsive to the erase command;
   applying an erase voltage greater than 0 v from the page buffer circuit during the erase operation to the first bit line in response to the control signals; and
   placing, by the page buffer circuit, the second bit line in a floating state at a same time that the erase voltage is applied to the first bit line by the page buffer circuit, in response to the control signals.

11. The method of claim 10, wherein a length of a first connection line connecting the first bit line to the first cell string is different from a length of a second connection line connecting the second bit line to the second cell string.

12. The method of claim 10, further comprising applying from the page buffer circuit a precharge voltage to the second bit line to precharge the second bit line, before the erase voltage is applied to the first bit line.

13. A method of operating a memory device including a controller that provides control signals to a page buffer circuit, and including a first cell string and a second cell string respectively connected to a first bit line and a second bit line, the method comprising:
   receiving, by the controller, an erase command for an erase operation of memory cells included in the first cell string and the second cell string and providing the control signals responsive to the erase command;
   applying an erase voltage from the page buffer circuit during the erase operation to the first bit line in response to the control signals;
   placing, by the page buffer circuit, the second bit line in a floating state at a same time that the erase voltage is applied to the first bit line, in response to the control signals; and
   precharging the second bit line to a negative voltage by the page buffer circuit, before the erase voltage is applied to the first bit line.

14. The method of claim 13, wherein the precharging of the second bit line to the negative voltage by the page buffer circuit comprises:
   applying a first precharge voltage to the first bit line to precharge the first bit line, in a first time period;
   applying a second precharge voltage to the second bit line to precharge the second bit line in the first time period; and
   reducing a voltage applied to the first bit line and placing the second bit line in the floating state, in a second time period after the first time period.

* * * * *